US008129912B2

United States Patent
Ko et al.

(10) Patent No.: US 8,129,912 B2
(45) Date of Patent: Mar. 6, 2012

(54) ELECTRODE DEVICE AND APPARATUS FOR GENERATING PLASMA

(75) Inventors: Hee-Jin Ko, Gyeonggi-Do (KR); Woo-Young Chung, Gyeonggi-Do (KR)

(73) Assignee: Tes Co., Ltd., Gyeonggi-do (KR)

( * ) Notice: Subject to any disclaimer, the term of this patent is extended or adjusted under 35 U.S.C. 154(b) by 65 days.

(21) Appl. No.: 12/691,844

(22) Filed: Jan. 22, 2010

(65) Prior Publication Data

US 2011/0001430 A1    Jan. 6, 2011

(30) Foreign Application Priority Data

Jul. 6, 2009  (KR) ........................ 10-2009-0061176

(51) Int. Cl.
*H01J 7/24* (2006.01)
*H05B 31/26* (2006.01)
(52) U.S. Cl. .................. 315/111.21; 315/111.71
(58) Field of Classification Search ........... 315/111.01–111.91; 219/121.52; 438/729; 118/723 R
See application file for complete search history.

(56) References Cited

U.S. PATENT DOCUMENTS

| | | | |
|---|---|---|---|
| 6,353,201 B1 * | 3/2002 | Yamakoshi et al. | 219/121.52 |
| 6,363,881 B2 * | 4/2002 | Murata et al. | 118/723 E |
| 6,456,010 B2 * | 9/2002 | Yamakoshi et al. | 315/111.21 |
| 7,319,295 B2 | 1/2008 | Mashima et al. | |

* cited by examiner

*Primary Examiner* — Jacob Y Choi
*Assistant Examiner* — Henry Luong
(74) *Attorney, Agent, or Firm* — Ladas & Parry LLP

(57) ABSTRACT

Provided are an electrode device and an apparatus for generating plasma. The electrode device for generating plasma includes: a planar member disposed to face a susceptor supporting a substrate and generating plasma between the substrate and the planar member; and a linear member providing a high frequency signal to the planar member via a plurality of feeding points that are electrically connected to the planar member and allowing admittance to be reduced as the linear member is closer to the feeding points on a path from supply points at which the high frequency signal is supplied to the linear member, to each of the feeding points, wherein the linear ember includes a connection unit, the connection unit including: a first member connecting two feeding points from among four feeding points disposed adjacent to one another in a straight line and is disposed to be separated from a plane that includes the straight line in which the feeding points are formed and forms a predetermined angle with the planar member; and a second member connecting two feeding points to which the first member is not connected, from among the four feeding points and is disposed symmetrical with the first member with respect to the plane that includes the straight line in which the feeding points are formed.

18 Claims, 29 Drawing Sheets
(8 of 29 Drawing Sheet(s) Filed in Color)

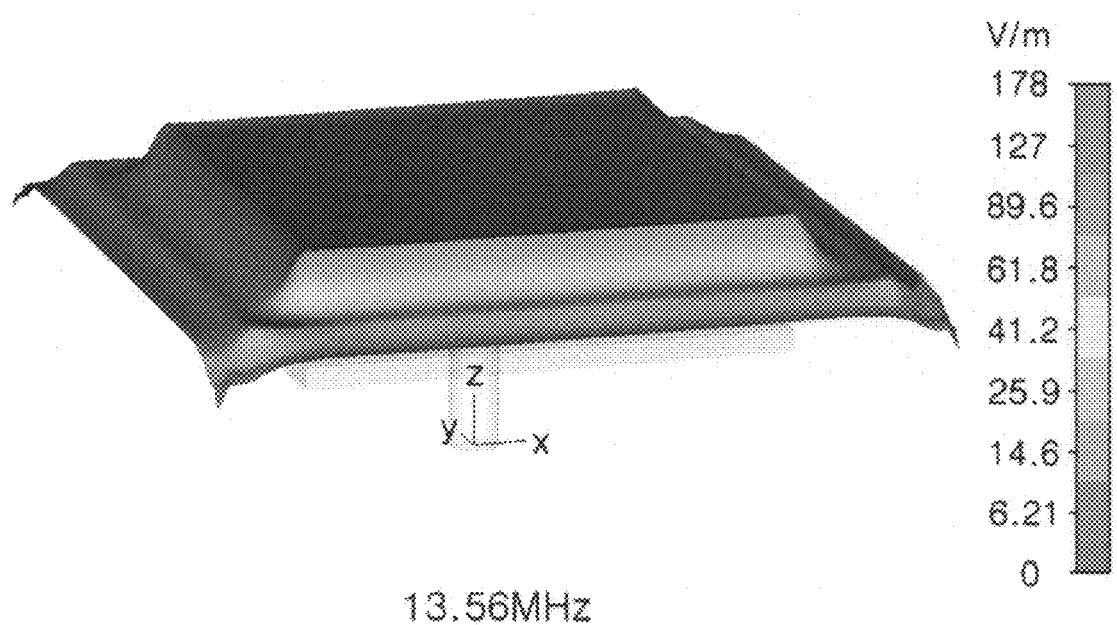

27.12MHz

40MHz

60MHz

80MHz

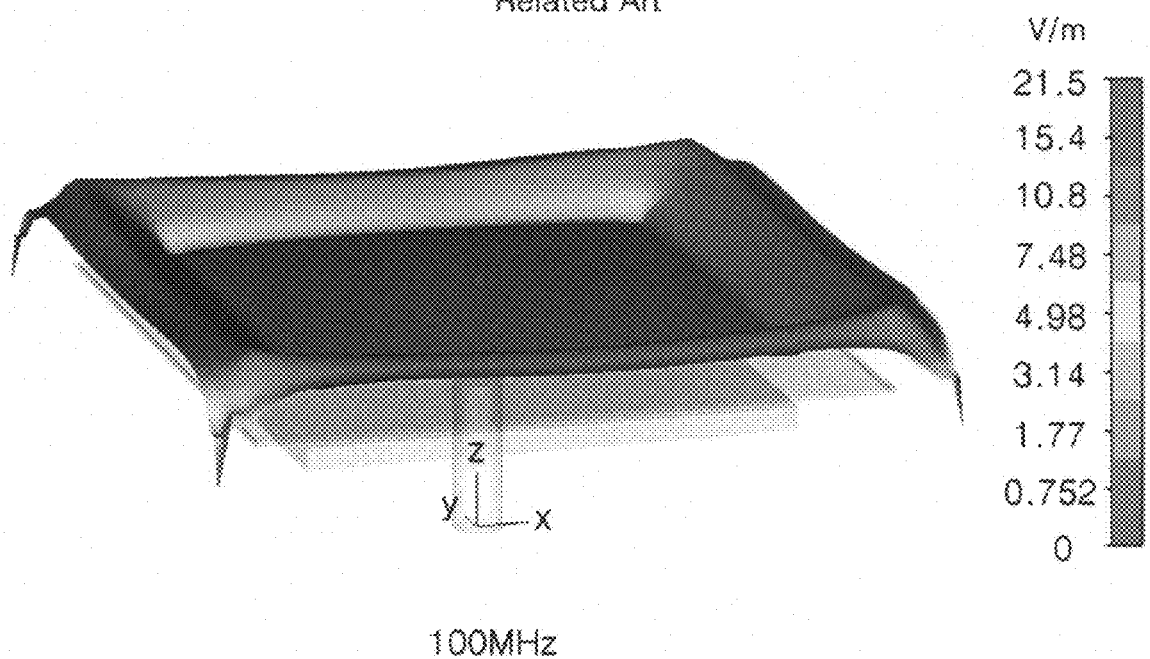

13.56MHz 27.12MHz

40MHz

60MHz

80MHz

100MHz

ELECTRODE DEVICE AND APPARATUS FOR GENERATING PLASMA

CROSS-REFERENCE TO RELATED PATENT APPLICATION

This application claims the benefit of Korean Patent Application No. 10-2009-0061176, filed on Jul. 6, 2009, in the Korean Intellectual Property Office, the disclosure of which is incorporated herein in its entirety by reference.

BACKGROUND OF THE INVENTION

1. Field of the Invention

The present invention relates to an electrode device and apparatus for generating plasma, and more particularly, to an electrode device and an apparatus for generating plasma in an upper portion of a substrate disposed on a susceptor according to a high frequency signal supplied to the electrode device.

2. Description of the Related Art

In semiconductor and display fabrication processes, plasma technology has been more important and plasma has been widely used, because plasma is gas comprised of charge particles and electrons, ions and active species in the plasma can be controlled by controlling parameters such as an electric field, a magnetic field, etc.

In the current fields of semiconductors and displays, a method of generating plasma by using a radio frequency has been mostly used. The method of generating plasma by using the radio frequency includes a method of generating plasma by using inductively coupled plasma (ICP) and a method of generating plasma by using capacitively coupled plasma (CCP).

Structural characteristics of the method of generating plasma by using the CCP are in that there is an electrode device designed to apply voltage. As known from the name of CCP, plasma is generated and sustained by a capacitive electric field formed due to charges distributed on the surface of the electrode device. In the method of generating plasma by using the CCP, plasma is generated and controlled by an electric field formed between upper and lower electrodes. The electric field is very sensitive to shapes of the upper and lower electrodes and material properties, mechanical characteristics, electrical characteristics and geometrical characteristics of peripheral structures. Thus, it is difficult to control the plasma by using the electric field. Thus, considerable know-how is needed to constitute hardware.

As described above, plasma is used to form a layer by using a predetermined material on a large-sized substrate in the fields of semiconductors, displays, and solar light. In this case, in order to attain productivity with low costs and high efficiency, the large-sized substrate needs to be processed. In order to process the large-sized substrate, high-density plasma having high deposition speed should be generated. High electrical energy is used to generate the high-density plasma, and a high supply frequency is needed to improve energy transmission between the supplied electrical energy and plasma.

In the related art, a large-sized flat electrode device is used to form a layer by using a predetermined material on a substrate by using plasma. FIG. 1 is a view of a large-sized flat electrode device disposed on a susceptor, and FIGS. 2A through 2F are images showing losses of electrical power that occurs in the large-sized flat electrode device of FIG. 1 according to frequencies. Referring to FIGS. 2A through 2F, frequency is improved so as to generate a high-density plasma. As frequency increases, a rapid loss of electrical power occurs in the large-sized flat electrode device of FIG. 1.

In order to solve the problem of the large-sized flat electrode device of FIG. 1, a linear electrode device including linear elements has been developed. Plasma having the frequency of 30 MHz to 300 MHz at a very high frequency (VHF) band is required to reduce ion collision energy and to perform high-efficiency deposition. FIG. 3 is a view of a conventional ladder-shaped electrode device. Referring to FIG. 3, electrical power having the frequency of 60 MHz at a VHF band is divided into two routes and is supplied to one and the other ends of the electrode device. In this case, electrical power having the same frequency having only a phase difference caused by a phase shifter is supplied to one and the other ends of the electrode device.

FIGS. 4A and 4B are images showing the distribution of electric potentials formed on the surface of the conventional ladder-shaped electrode device illustrated in FIG. 3 when electrical power having the same frequency is supplied to the ladder-shaped electrode device of FIG. 3. Referring to FIGS. 4A and 4B, when electrical power having the frequency that is equal to or lower than 40 MHz is supplied to the ladder electrode device of FIG. 3, a forwarded wave is generated and uniform plasma is generated. However, when electrical power having the frequency that is equal to or higher than 60 MHz is supplied to the ladder electrode device of FIG. 3, distribution of electric potentials formed on the surface of the electrode device causes a pattern of a standing wave, and plasma corresponding to the pattern of the standing wave is generated. In this case, a node that is a characteristic of the standing wave is formed so that uniformity of the plasma lowers.

As described above, frequency at a VHF band is used in discharge so that high-density plasma causing a strong chemical reaction with a large-sized substrate can be generated. The density of the generated plasma is in proportion to the square of a discharge frequency. As the thickness of a boundary surface of the plasma decreases due to high resonant characteristics at the VHF band, energy coupling between the ladder-shaped electrode device of FIG. 3 and the plasma is further improved and the density of the plasma is increased. However, a reduction in wavelength according to an increase in plasma discharge frequency causes variation of amplitudes of voltage and current inside a source and variation of phases so that strong wave characteristics of voltage and current occur. When the standing wave that is one of the wave characteristics oscillates on the electrode device, the uniformity of a surface on which the plasma is to be deposited lowers greatly. Also, due to the formation of a node that is a characteristic of the standing wave, the density of the plasma at the surface on which the plasma is to be deposited lowers. Thus, a degree of ionization of neutral particles lowers, and discharge is not partially performed so that deposition cannot be properly performed. Accordingly, an electrode device that prevents generation of the standing wave is needed.

SUMMARY OF THE INVENTION

The present invention provides an electrode device and an apparatus for generating plasma having a uniform density by minimizing a reflection coefficient and by suppressing generation of a standing wave when a high frequency signal is used to generate high-density plasma on a large-sized substrate.

According to an aspect of the present invention, there is provided an electrode device for generating plasma, the electrode device including: a planar member disposed to face a susceptor supporting a substrate and generating plasma between the substrate and the planar member; and a linear member providing a high frequency signal to the planar member via a plurality of feeding points that are electrically connected to the planar member and allowing admittance to be reduced as the linear member is closer to the feeding points on a path from supply points at which the high frequency signal is supplied to the linear member, to each of the feeding points, wherein the linear member includes a connection unit, the connection unit including: a first member connecting two feeding points from among four feeding points disposed adjacent to one another in a straight line and is disposed to be separated from a plane that includes the straight line in which the feeding points are formed and forms a predetermined angle with the planar member; and a second member connecting two feeding points to which the first member is not connected, from among the four feeding points and is disposed symmetrical with the first member with respect to the plane that includes the straight line in which the feeding points are formed.

According to another aspect of the present invention, there is provided an apparatus for generating plasma, the apparatus including: an electrode device generating plasma between the electrode device and a substrate disposed in a lower portion of the electrode device due to a high frequency signal supplied to the electrode device; a power supply unit generating a high frequency signal to be supplied to the electrode device; and a feedthrough providing the high frequency signal supplied by the power supply unit to the electrode device, wherein the electrode device includes: a planar member disposed to face a susceptor supporting a substrate and generating plasma between the substrate and the planar member; and a linear member providing a high frequency signal to the planar member via a plurality of feeding points that are electrically connected to the planar member and allowing admittance to be reduced as the linear member is closer to the feeding points on a path from supply points at which the high frequency signal is supplied to the linear member, to each of the feeding points, wherein the linear member includes a connection unit, the connection unit including: a first member connecting two feeding points from among four feeding points disposed adjacent to one another in a straight line and is disposed to be separated from a plane that includes the straight line in which the feeding points are formed and forms a predetermined angle with the planar member; and a second member connecting two feeding points to which the first member is not connected, from among the four feeding points and is disposed symmetrical with the first member with respect to the plane that includes the straight line in which the feeding points are formed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features and advantages of the present invention will become more apparent by describing in detail exemplary embodiments thereof with reference to the attached drawings in which:

FIGS. 2A through 2F are images showing losses of electrical power that occurs in the large-sized flat electrode device of FIG. 1 according to frequencies;

DETAILED DESCRIPTION OF THE INVENTION

Hereinafter, the present invention will be described in detail by explaining exemplary embodiments of the invention with reference to the attached drawings.

FIGS. 5A through 5D are views of an electrode device 100 for generating plasma according to an embodiment of the present invention. Referring to FIGS. 5A through 5D, the electrode device 100 for generating the plasma according to the present embodiment includes a planar member 110 and two linear members 120.

The planar member 110 is disposed to face a susceptor that supports a substrate and generates plasma between the substrate and the planar member 110. The planar member 110 may include a plurality of rod-shaped frames separated from one another to be parallel to one another, as illustrated in FIGS. 5A and 5B, and may include a lattice-shaped frame, as illustrated in FIG. 5C, and may include a rectangular plate shape, as illustrated in FIG. 5D.

Figure 1:
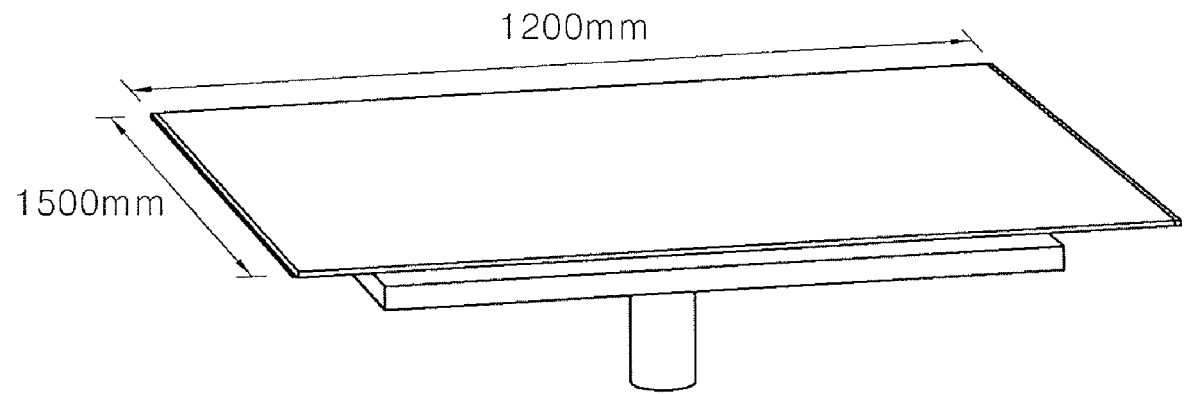
FIG. 1 is a view of a large-sized flat electrode device disposed on a susceptor.
Figure 2B:
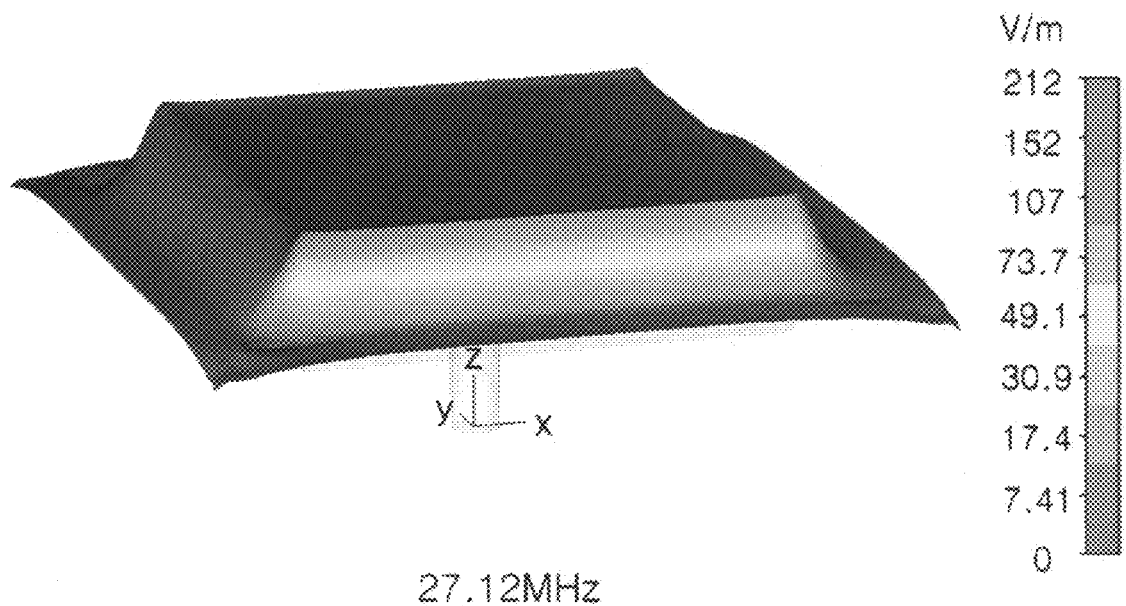
Figure 2C:
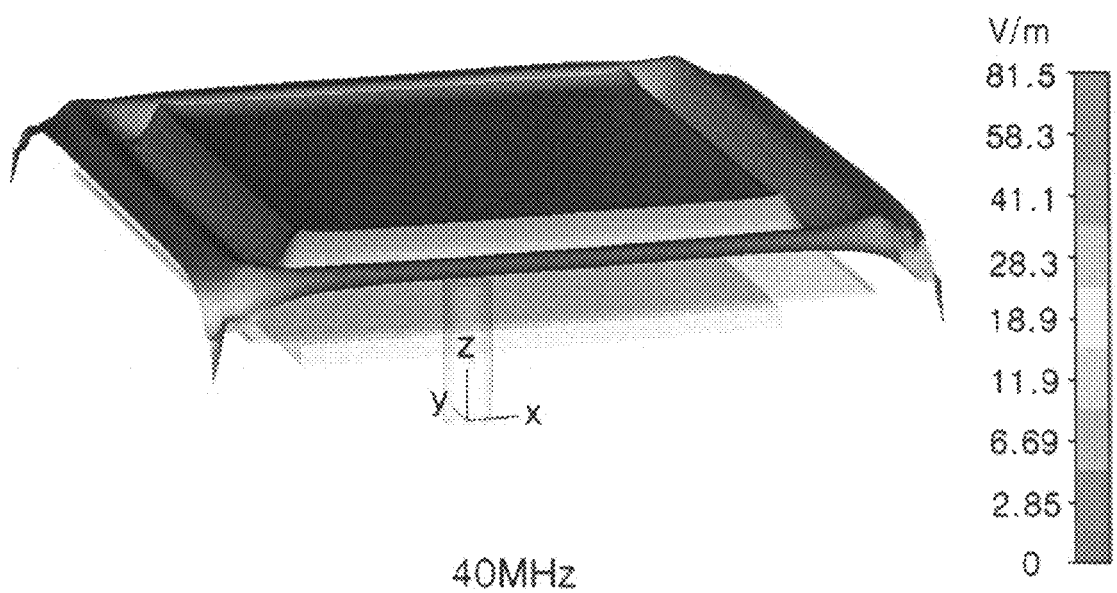
Figure 2D:
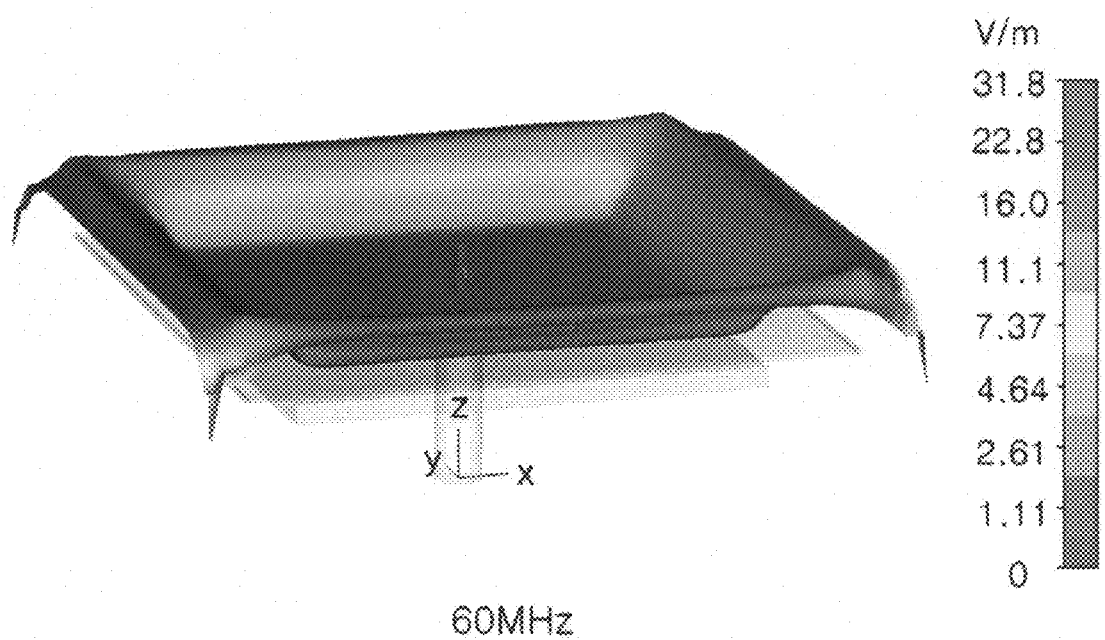
Figure 2E:
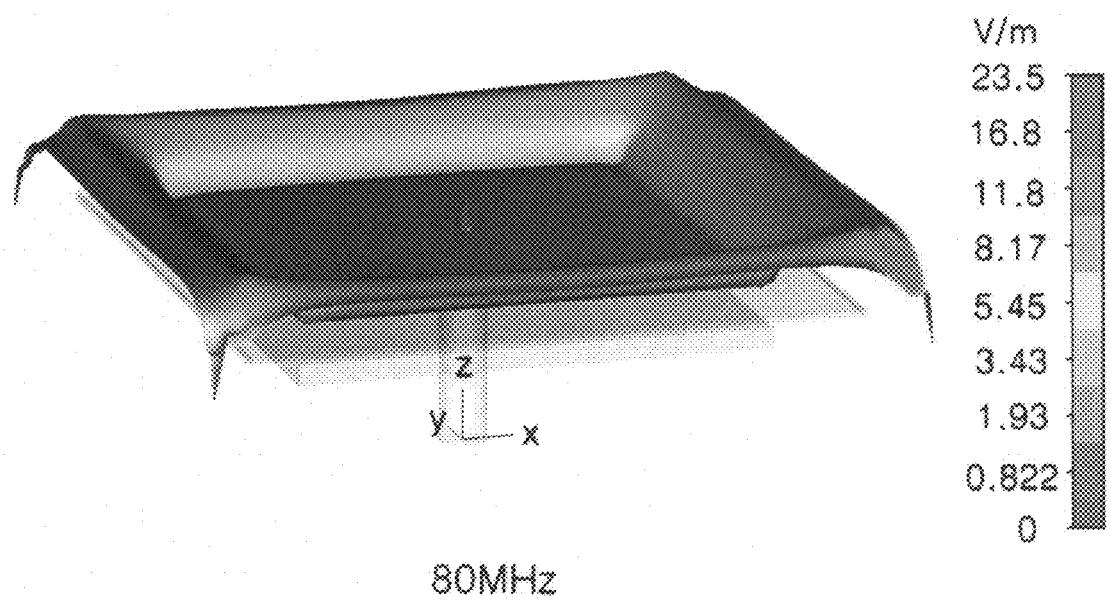
Figure 3:
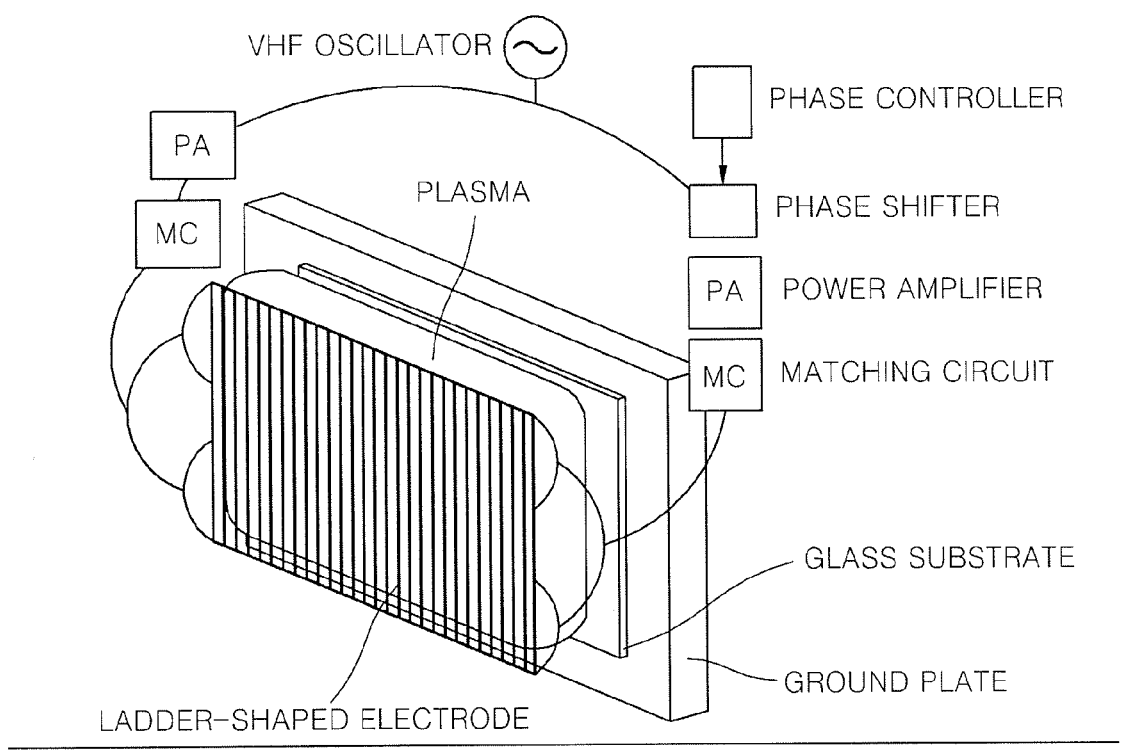
FIG. 3 is a view of a conventional ladder-shaped electrode device.
Figure 4A:
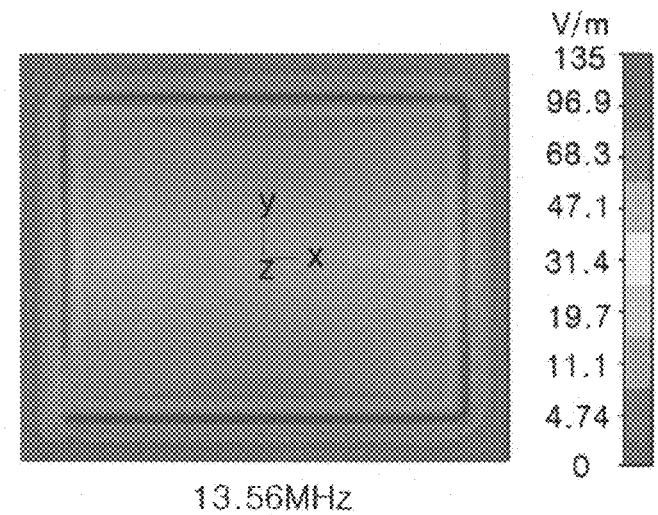
FIGS. 4A and 4B are images showing the distribution of electric potentials formed on the surface of the conventional ladder-shaped electrode device illustrated in FIG. 3 when electrical power having the same frequency is supplied to the ladder electrode device of FIG. 3.
Figure 4A:
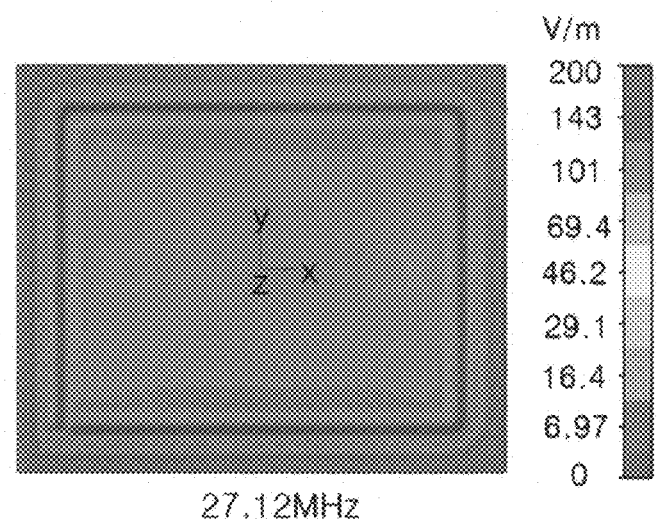
Figure 4A:
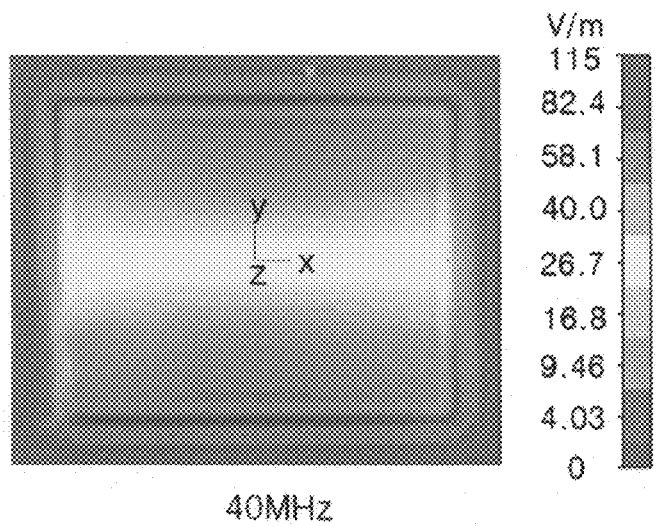
Figure 4B:
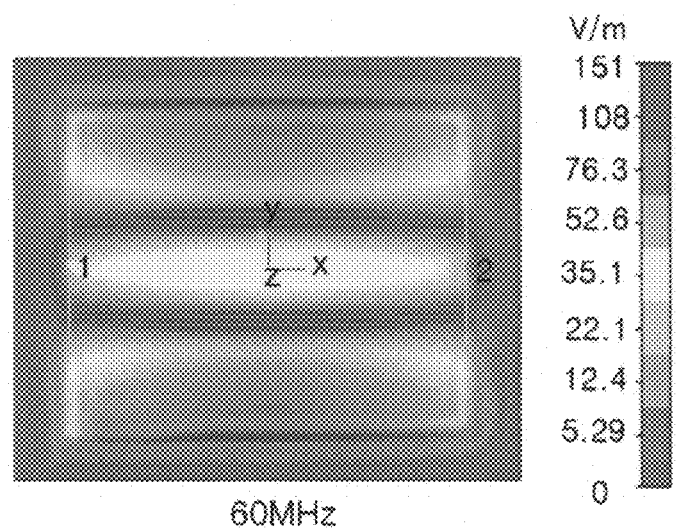
Figure 4B:
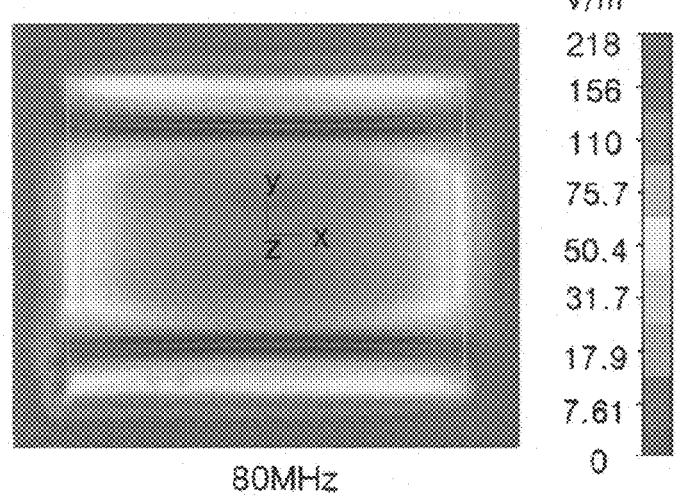
Figure 4B:
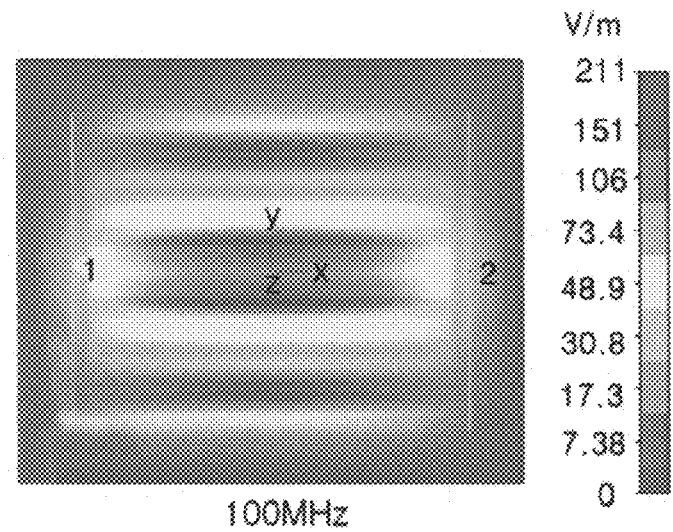
Figure 5A:
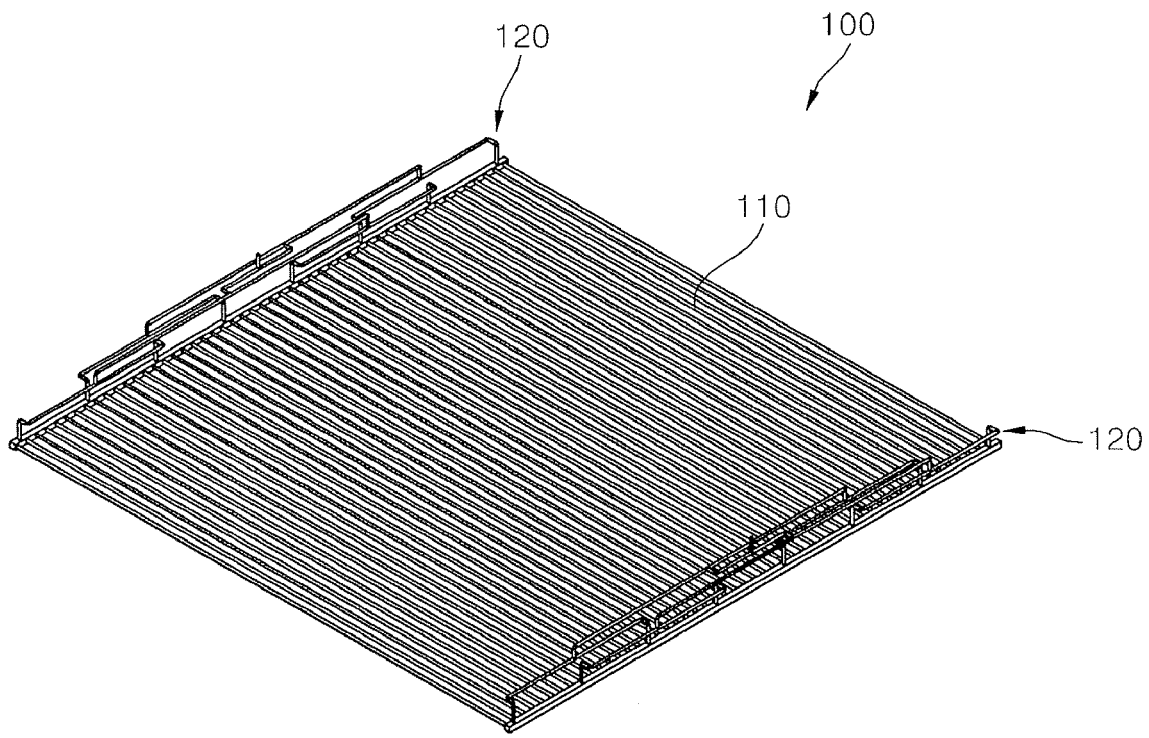
FIGS. 5A through 5D are views of an electrode device for generating plasma according to an embodiment of the present invention.
Figure 5B:
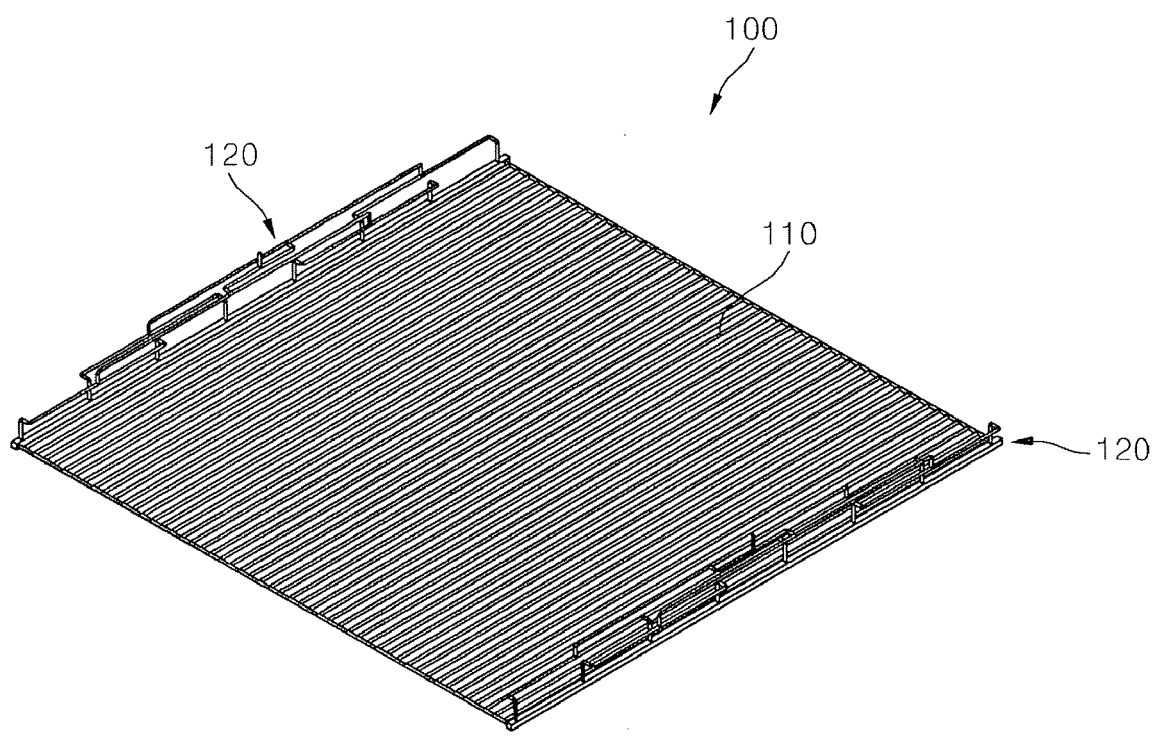
Figure 5C:
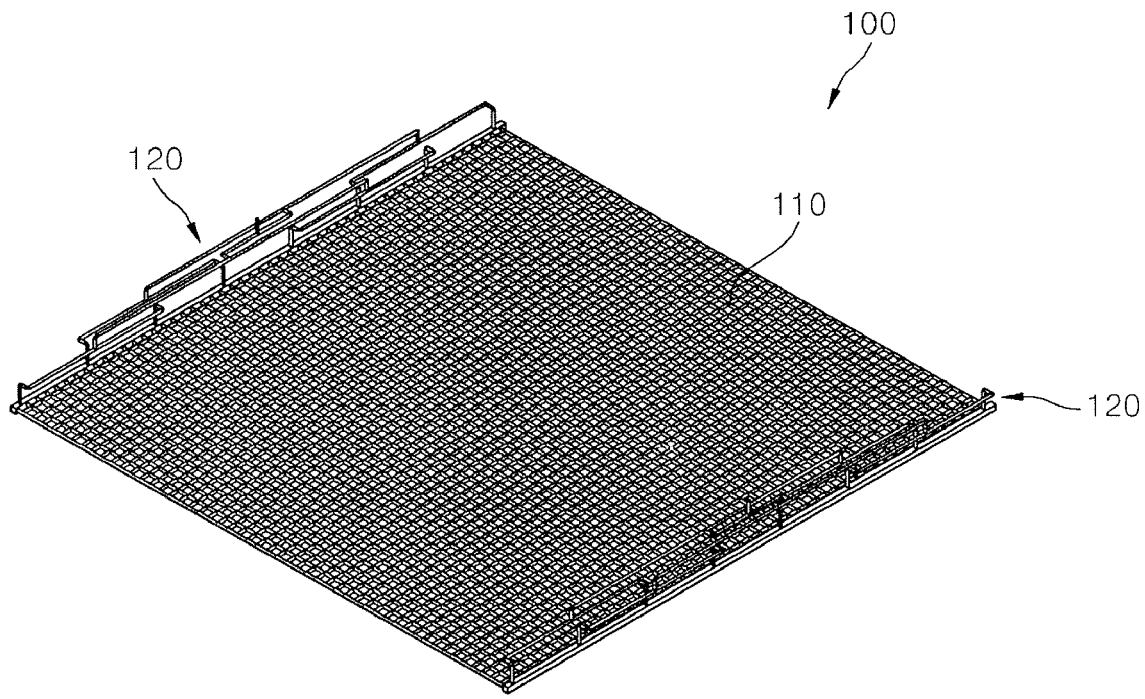
Figure 5D:
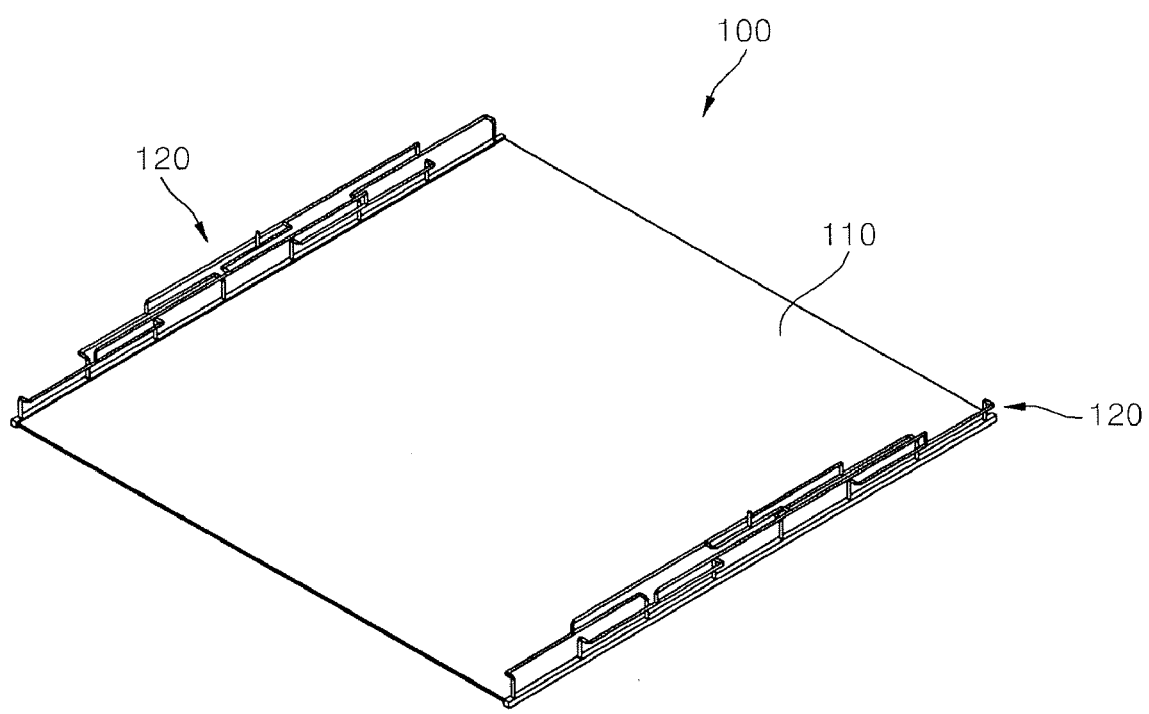

The two linear members 120 are coupled to the planar member 110, as illustrated in FIGS. 5A through 5D. The two linear members 120 are coupled to the planar member 110 so that the linear members 120 are perpendicular to the rod-shaped frames of the planar member 110, as illustrated in FIG. 5A, or so that the linear members 120 are parallel to the rod-shaped frames of the planar member 110, as illustrated in FIG. 5B. Also, as illustrated in FIGS. 5C and 5D, the linear members 120 may be coupled to the planar member 110 to face each other so that the linear members 120 are perpendicular to a top surface of the planar member 110. The linear members 120 may be coupled to the planar member 110 in other forms.

Figure 6A:
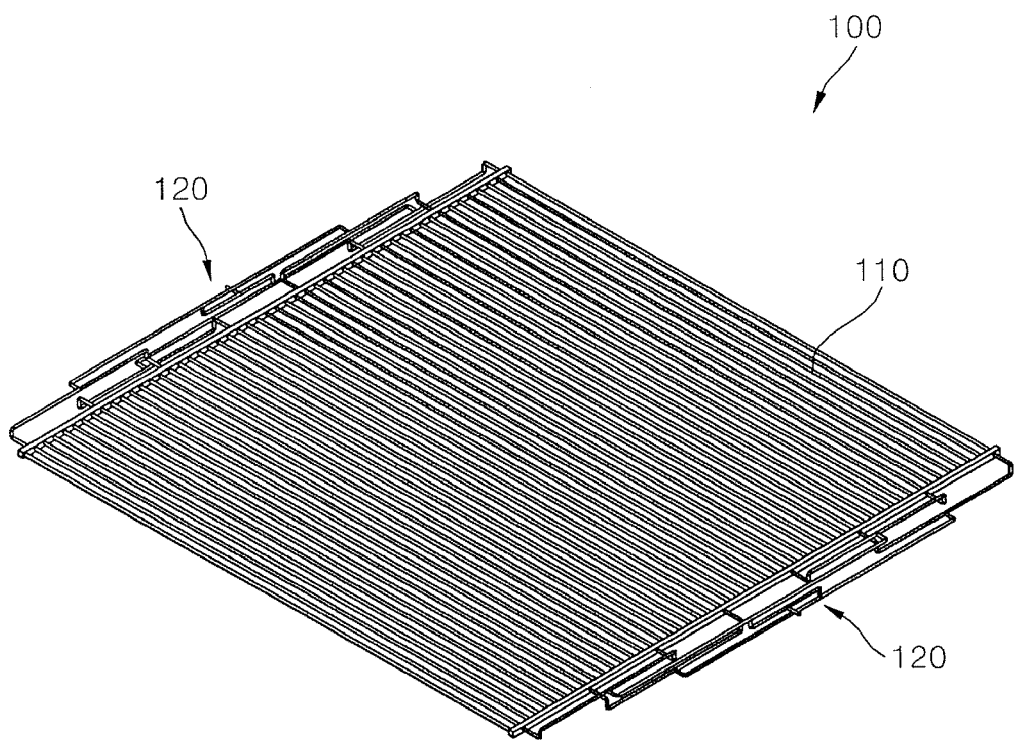
FIGS. 6A through 6C are views of shapes of two linear members coupled to a planar member, according to embodiments of the present invention.
Figure 6B:
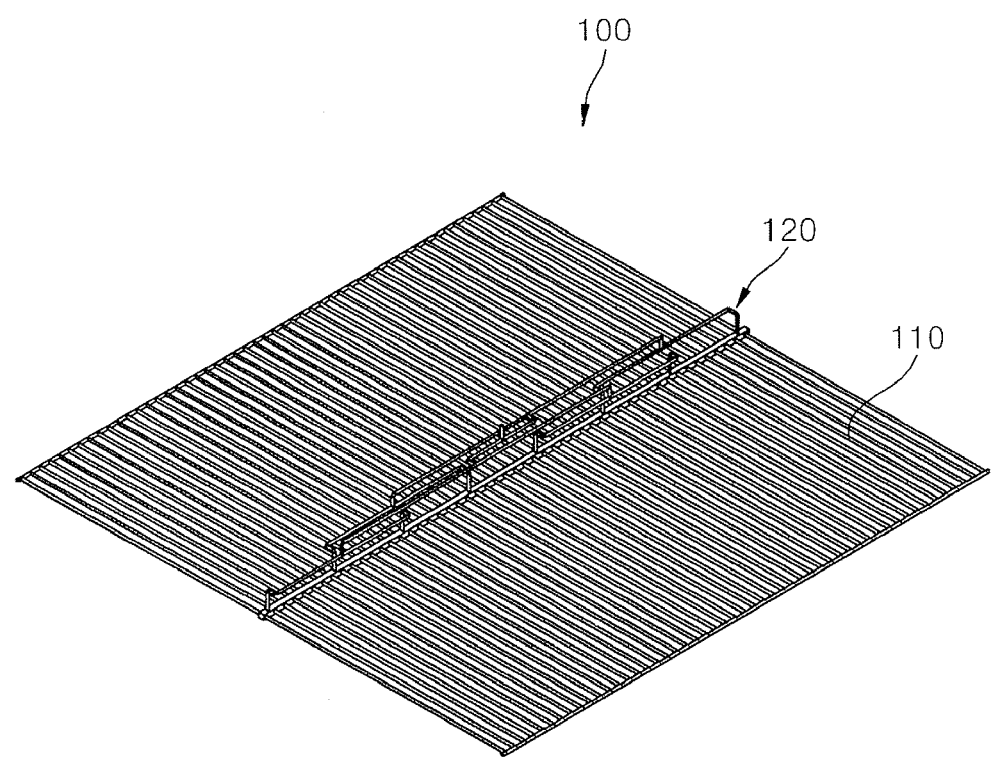
Figure 6C:
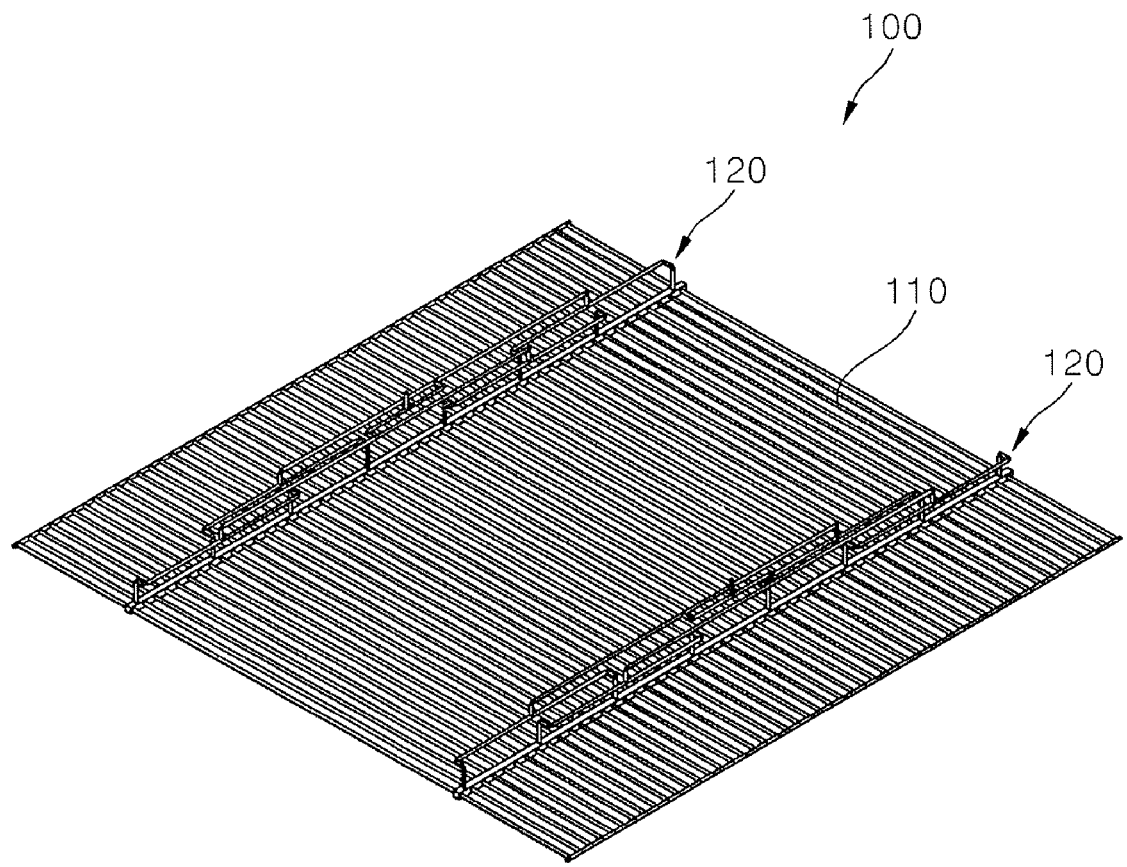

FIGS. 6A through 6C are views of shapes of the linear members 120 coupled to the planar member 110, according to embodiments of the present invention. Referring to FIGS. 6A through 6C, the two linear members 120 may be coupled to opposite sides of the planar member 110 so that they are disposed on the same plane as the planar member 110, as illustrated in FIG. 6A, and a linear member 120 may be coupled to the top surface of the planar member 110 so that it passes through the center of the planar member 110, as illustrated in FIG. 6B. Also, as illustrated in FIG. 6C, two linear members 120 may be coupled to the planar member 110 so that they are parallel to the top surface of the planar member 110. However, the present invention is not limited thereto. The planar member 110 and the linear members 120 may be coupled to each other in other forms.

When the electrode device 100 includes a plurality of linear members 120, a high frequency signal having the same frequency may be input to each linear member 120, and high frequency signals having different frequencies may also be input to the linear members 120. In this case, the frequencies of the high frequency signals input to the linear members 120 are in the range of 400 kHz to 300 MHz.

Each linear member 120 provides a high frequency signal to the planar member 110 via a plurality of feeding points that are electrically connected to the planar member 110 and allows admittance to be reduced as each linear member 120 is closer to the feeding points on a path from supply points at which the high frequency signal is supplied to the linear member 120, to each of the feeding points. To this end, each liner member 120 includes a connection unit.

FIGS. 7A through 7D illustrate shapes of connection units according to embodiments of the present invention. The connection units have other various shapes than the shapes of FIGS. 7A through 7D.

Referring to FIGS. 7A through 7D, each connection unit includes a first member 122 and a second member 123 which constitute the linear member 120. The first member 122 connects two feeding points from among four feeding points disposed adjacent to one another in a straight line and is disposed to be separated from a plane that includes the straight line in which the feeding points are formed and forms a predetermined angle with the planar member 110. The second member 123 connects two feeding points to which the first member 122 is not connected, from among the four feeding points and is disposed symmetrical with the first member 122 with respect to the plane that includes the straight line in which the feeding points are formed.

Figure 7A:
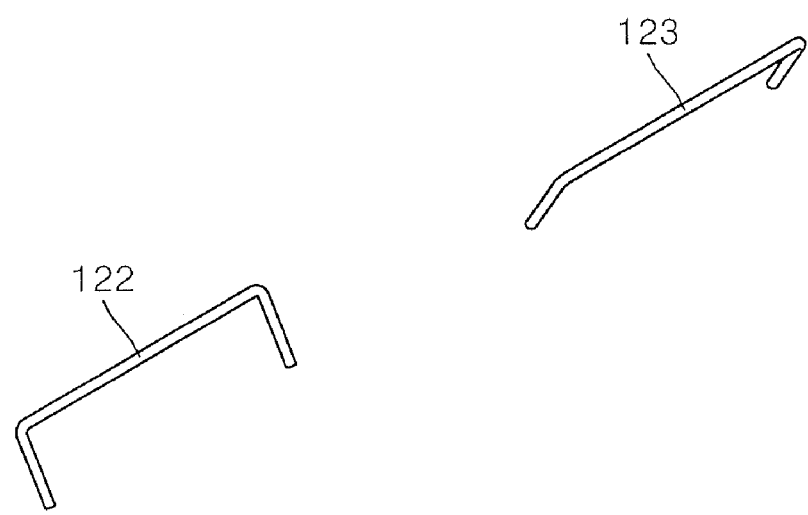
FIGS. 7A through 7D illustrate shapes of connection units according to embodiments of the present invention.
Figure 7B:
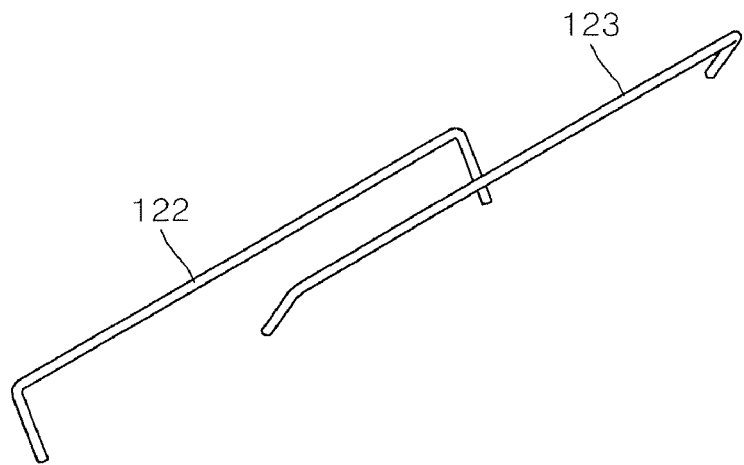

Referring to FIGS. 7A and 7B, the connection units are connected to four feeding points, and the first member 122 and the second member 123 are symmetrical with each other based on the plane that includes the straight line in which the feeding points are formed. In this case, the connection units may be constituted so that the first member 122 connects a first feeding point and a second feeding point to each other and the second member 123 connects a third feeding point and a fourth feeding point to each other, as illustrated in FIG. 7A. The connection units may also be constituted so that the first member 122 connects the first feeding point and the third feeding point to each other and the second member 123 connects the second feeding point and the fourth feeding point to each other, as illustrated in FIG. 7B.

Figure 7C:
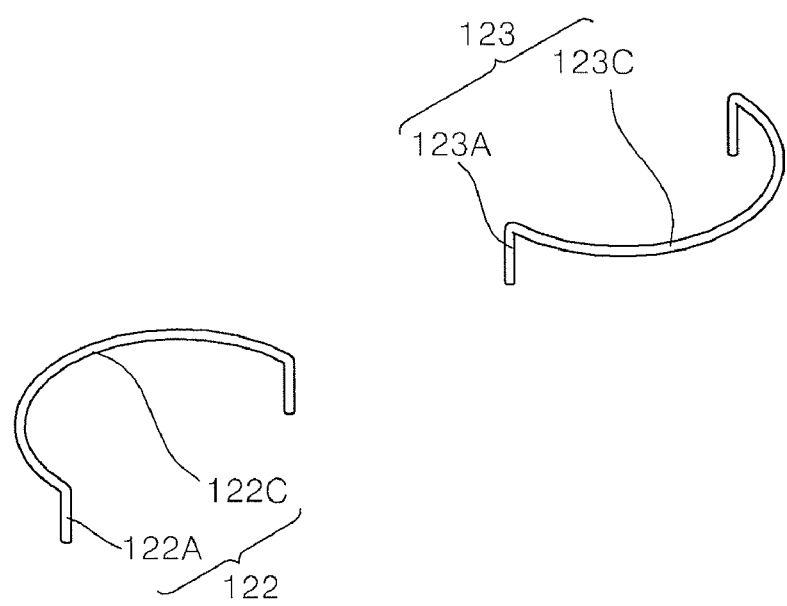
Figure 7D:
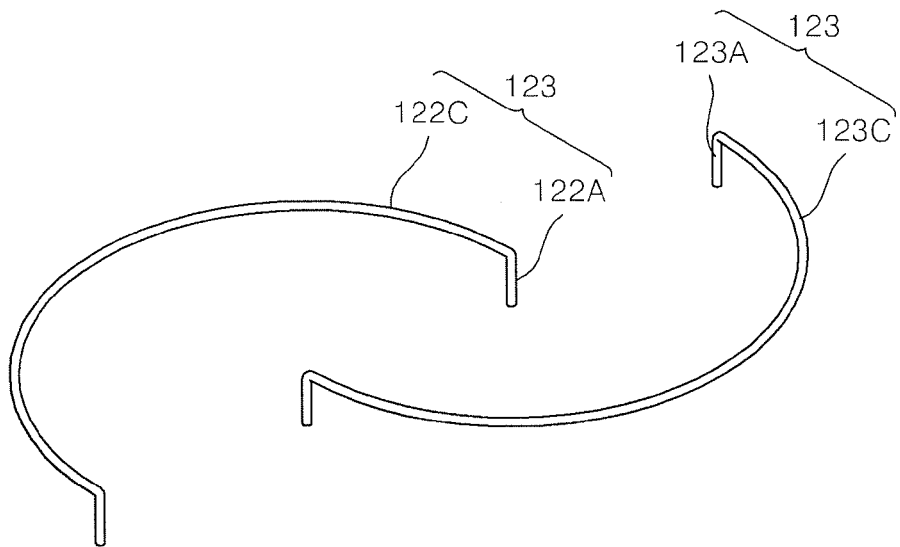

Referring to FIGS. 7C and 7D, the first member 122 of each connection unit includes a pair of first vertical portions 122A and a first connection portion 122C. The pair of first vertical portions 122A are connected to two feeding points from among four feeding points and are parallel to each other. The first connection portion 122C connects ends of the pair of first vertical portions 122A to each other and is disposed to be separated from a plane that includes the first vertical portions 122A. The second member 123 of each connection unit includes a pair of second vertical portions 123A and a second connection portion 123C. The pair of second vertical portions 123A are connected to two feeding points to which the first vertical portions 122A are not connected, from among the four feeding points and are parallel to each other. The second connection portion 123C connects ends of the pair of second vertical portions 123A to each other and is disposed symmetrical with the first connection portion 122C with respect to a plane that includes the second vertical portions 123A.

Figure 8A:
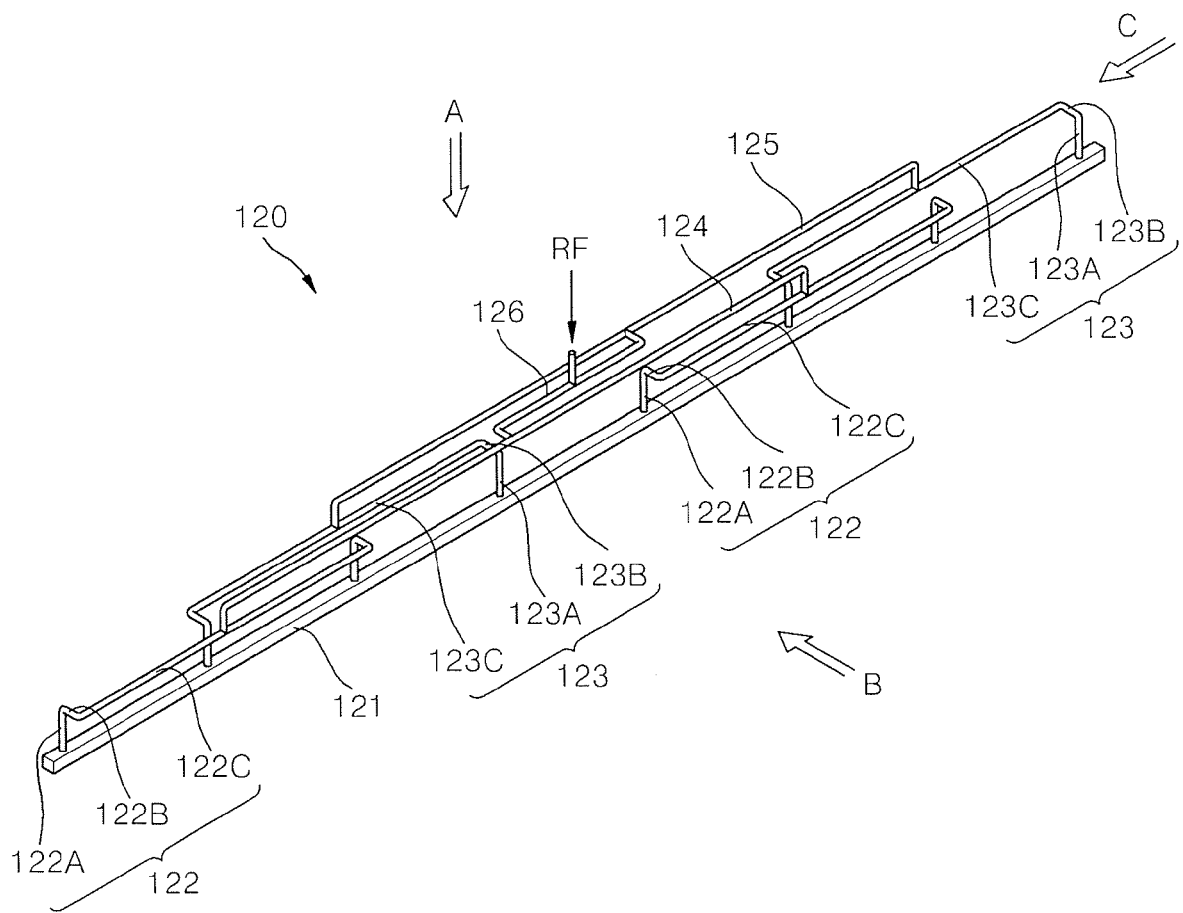
FIG. 8A is a perspective view of a linear member.
Figure 8B:
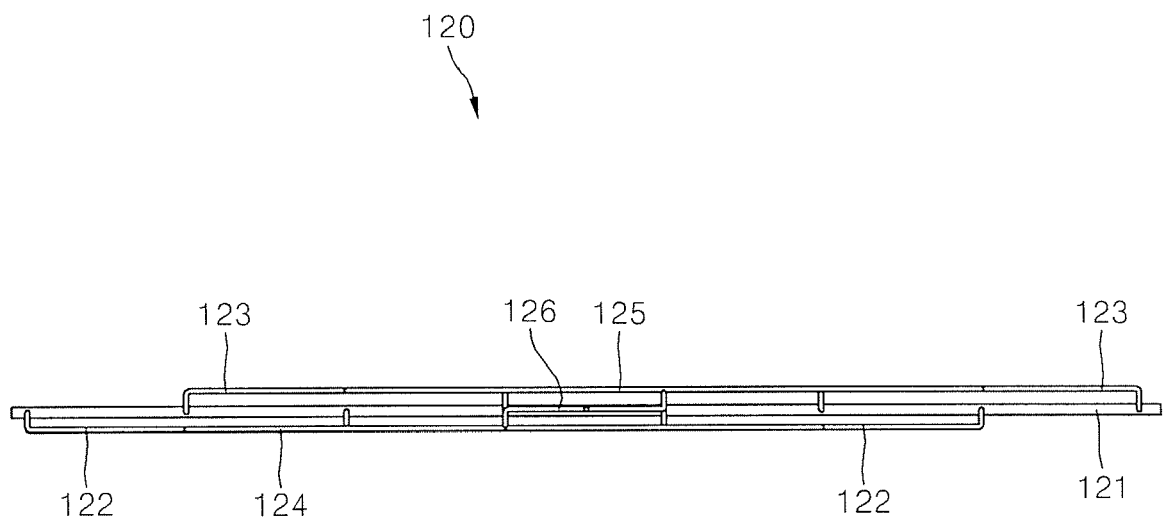
FIG. 8B is a plan view of the linear member shown in FIG. 8A in a direction A.
Figure 8C:
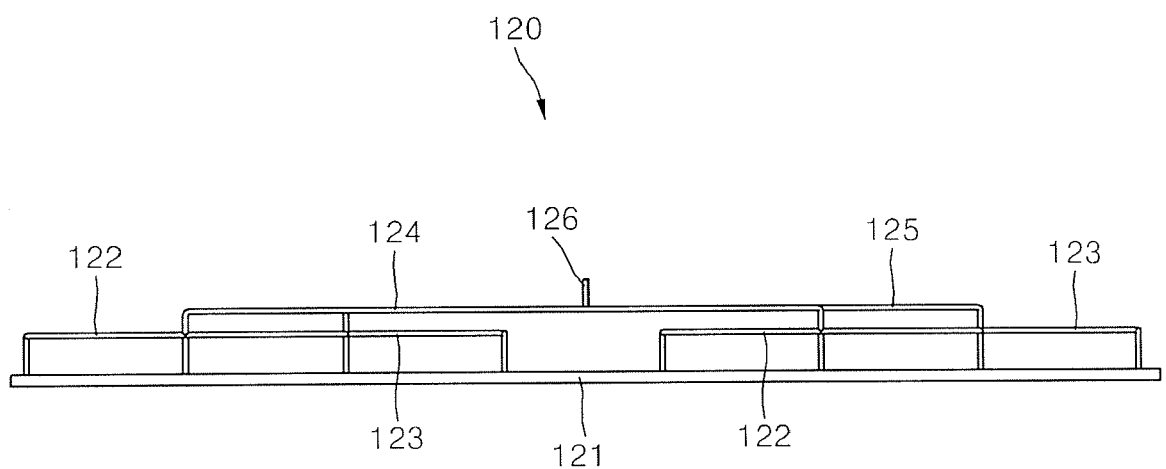
FIG. 8C is a front view of the linear member of FIG. 8A in a direction B.
Figure 8D:
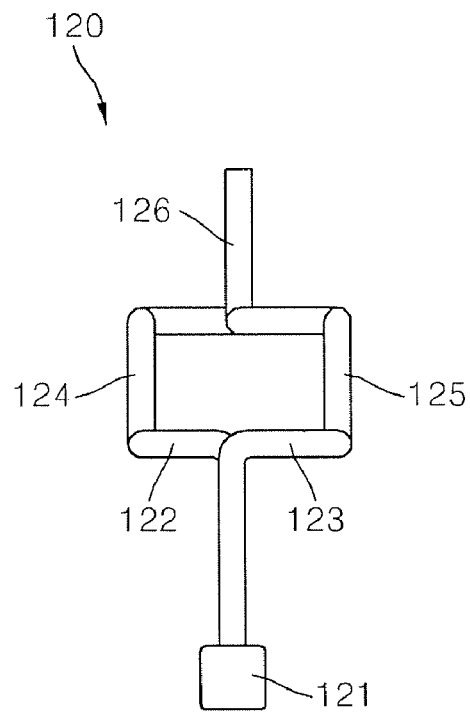
FIG. 8D is a side view of the linear member of FIG. 8A in a direction C.

Each linear member 120 includes one or a plurality of connection units having the above structure described. FIG. 8A is a perspective view of a linear member 120, and FIG. 8B is a plan view of the linear member 120 shown in FIG. 8A in a direction A, and FIG. 8C is a front view of the linear member 120 of FIG. 8A in a direction B, and FIG. 8D is a side view of the linear member 120 of FIG. 8A in a direction C. Hereinafter, the structure of the linear member 120 will be described in detail with reference to FIGS. 8A through 8D.

Referring to FIGS. 8A through 8D, the linear member 120 has a three dimensional structure including two connection units. The linear member 120 may be directly connected to a plurality of feeding points formed on the planar member 110 or may be connected to the planar member 110 by a base member 121 having a top surface in which a plurality of feeding points are formed. In this case, the number of the feeding points may be eight, as shown in FIGS. 8A through 8D, or may be a multiple of eight.

A plurality of first members 122 and a plurality of second members 123 are coupled to each feeding point formed on the base member 121 or formed on the planar member 110. In other words, when the number of feeding points is eight, as illustrated in FIGS. 8A through 8D, two first members 122 are coupled to four feeding points.

Each first member 122 includes a pair of first vertical portions 122A, a pair of first extension portions 122B, and a first connection portion 122C. The pair of first vertical portions 122A extend in a direction and are connected to each feeding point to be parallel to each other. The pair of first extension portions 122B extend in a direction that crosses the lengthwise direction of the first vertical portions 122A from each end of the pair of first vertical portions 122A. The first connection portion 122C connects ends of the pair of first extension portions 122B to each other. In this case, the pair of first extension portions 122B may extend to a direction that is perpendicular to the lengthwise direction of the first vertical portions 122A.

Each second member 123 includes a pair of second vertical portions 123A, a pair of second extension portions 123B, and a second connection portion 123C. The pair of second vertical portions 123A extend in a direction and are connected to each feeding point alternately with each first vertical portion 122A to be parallel to each other. The pair of second extension portions 123B extend in a different direction from the lengthwise direction of the first extension portions 122B based on a plane that includes the second vertical portions 123A from each end of the pair of second vertical portions 123A. The second connection portion 123C connects ends of the pair of second extension portions 123B to each other. When eight feeding points are formed in a straight line, each first vertical portion 122A and each second vertical portion 123B are alternately disposed on the same plane. Also, lengths of the first and second vertical portions 122A and 123A, the first and second extension portions 122B and 123B, and the first and second connection portions 122C and 123C of the first and second members 122 and 123 are respectively the same.

The first member 122 and the second member 123 may be rotated around the straight line in which feeding points are formed. In other words, the first vertical portion 122A of each first member 122 and the second vertical portion 123A of each second member 123 may be perpendicular to the top surface of the planar member 110 or may be inclined at a predetermined angle. Since other elements are coupled to upper portions of each first member 122 and each second member 123, all of the first members 122 and the second members 123 are coupled to the base member 121 or the planar member 110 to have the same angle with respect to the top surface of the planar member 110.

Referring to FIGS. 8A through 8D, when the linear member 120 includes a plurality of connection units, a unit for connecting the plurality of connection units such as a first connection member 124 and a second connection member 125 is needed. In this case, the first connection member 124 connects a plurality of first members 122, and the second connection member 125 connects a plurality of second members 123.

Specifically, the first connection member 124 is disposed above the plurality of first members 122 separated from one another in a direction, and both ends of the first connection member 124 are connected to the center of the first connection portion 122C. Also, the second connection member 125 is disposed above the plurality of second members 123 separated from one another in the same direction as the direction of arrangement of the first members 122, and both ends of the second connection member 125 are connected to the center of the second connection portion 123C. Also, the height of the first connection member 124 and the height of the second connection member 125 are the same. The linear member 120 has a two-layer stacked shape formed by connecting the first members 122 and the second members 123 and the first connection member 124 and the second connection member 125.

Last, a feeding member 126 connects centers of the first connection member 124 and the second connection member 125 so that a supply point of a high frequency signal is in the center of the feeding member 126. As illustrated in FIG. 8A, the feeding member 126 may have a shape in which both ends of the feeding member 126 are bent in opposite directions so that the feeding member 126 is coupled to the centers of the first connection member 124 and the second connection member 125, or may have a shape of a straight line for connecting the centers of the first connection member 124 and the second connection member 125.

Also, a high frequency signal is supplied to the center of the feeding member 126, and the high frequency signal supplied to the feeding member 126 passes through the first members 122 and the second members 123 via the first and second connection members 124 and 125 and is transmitted to the feeding point that is in the top surface of the base member 121 or the planar member 110. After that, due to the high frequency signal supplied to the planar member 110, plasma is generated between the planar member 110 and the substrate disposed on a lower portion of the electrode device 100 illustrated in FIGS. 5A through 5D. The electrode device 100 for generating plasma, illustrated in FIGS. 5A through 5D has a three dimensional and symmetrical structure viewed from the front and the side, as illustrated in FIGS. 8A through 8D. Thus, electrical lengths from the center of the feeding member 126 to which the high frequency signal is supplied, to each feeding point are all the same.

When the number of feeding points is a multiple of eight, i.e., 8, 16, . . . , etc., the electrode device 100 of FIGS. 5A through 5D may be implemented by connecting the plurality of linear members 120 having the shape of FIGS. 8A through 8D in parallel in a lateral direction.

Figure 9:
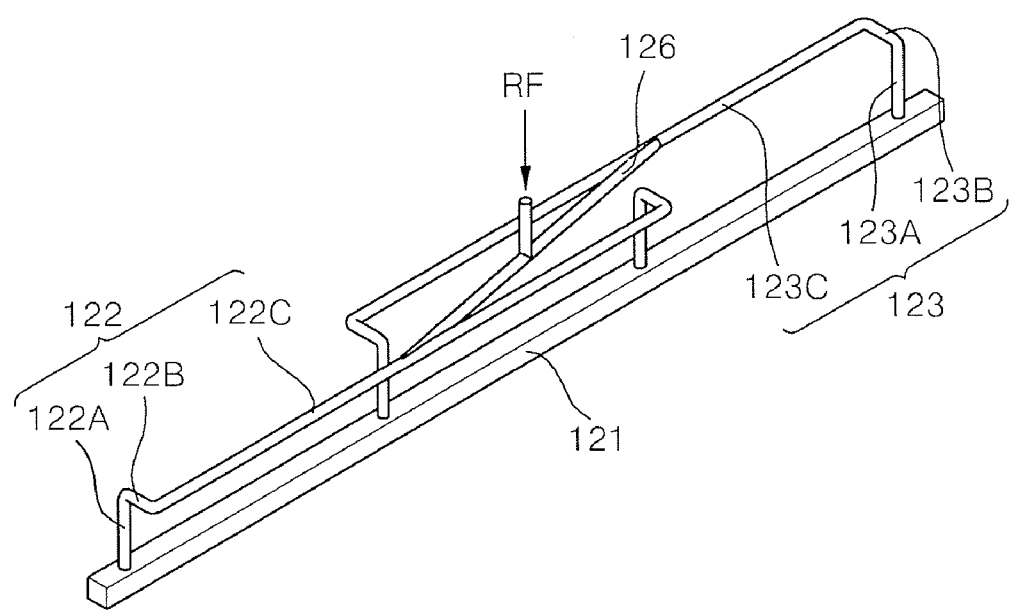
FIG. 9 illustrates a linear member having four feeding points according to an embodiment of the present invention.

When the number of feeding points is four, i.e., when the linear member 120 includes a connection unit, the linear member 120 may have a symmetrical structure. FIG. 9 illustrates the linear member 120 having four feeding points according to an embodiment of the present invention. Referring to FIG. 9, since the number of feeding points is four, a first member 122 and a second member 123 are coupled to the feeding points so that each of the first and second vertical portions 122A and 123A is alternately disposed. Since a first member 122 and a second member 123 are disposed, the first connection member 124 and the second connection member 125 do not need to be provided unlike when the number of feeding members is eight. Thus, the feeding member 126 connects the center of the first connection portion 122C of the first member 122 and the center of the second connection portion 123C of the second member 123, and a high frequency signal is input to the center of the feeding member 126. Even when the linear member 120 of the electrode device 100 for generating plasma illustrated in FIGS. 5A through 5D has the structure as shown in FIG. 9, electrical lengths from the center of the feeding member 126 to which the high frequency signal is input, to each feeding point are all the same and thus, high frequency signals are uniformly distributed to the feeding member 126.

The electrode device 100 for generating plasma illustrated in FIGS. 5A through 5D includes the linear member 120 having a three dimensional and symmetrical structure, as illustrated in FIGS. 8A through 8D or 9, so that generation of a standing wave is suppressed in the planar member 110 and plasma having a uniform density can be generated in an upper portion of the substrate. Hereinafter, a principle for suppressing generation of the standing wave due to the electrode device 100 for generating plasma illustrated in FIGS. 5A through 5D will be described in detail.

As described previously, electrical power supplied from a high frequency power supply source is used so as to generate plasma in the upper portion of the substrate. In this case, when an impedance of an electrode device to which a high frequency signal is supplied and an impedance of the plasma generated by the electrode device are matched by an impedance matcher to 50Ω that is a characteristic impedance of a circuit, reflection power between the high frequency power supply source and the impedance matcher is not generated and electrical power supplied by the high frequency power supply source is transmitted to the plasma via the electrode device.

Figure 10A:
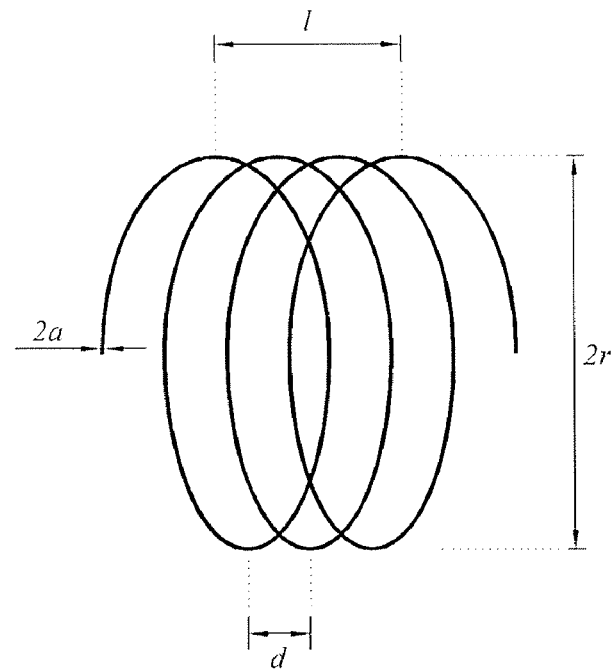
FIGS. 10A and 10B illustrate the state of the electrode device illustrated in FIGS. 5A through 5D, by using a circuit element according to the frequency of an input signal.
Figure 10B:
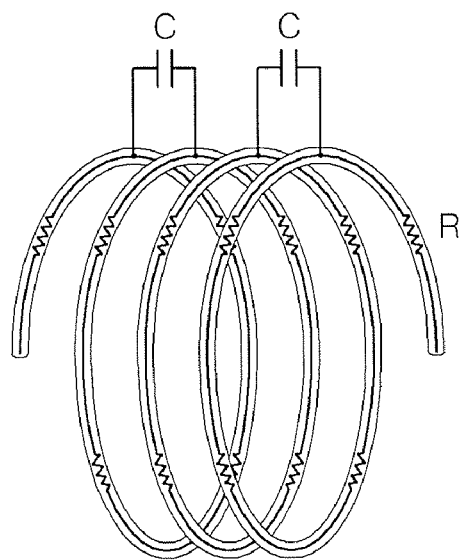

FIGS. 10A and 10B illustrate states of electrode devices according to the frequency of an input signal by using a circuit element. Referring to FIG. 10A, when an electrode device is smaller than the wavelength of an input frequency, i.e., when a signal at a low-frequency band is input to the electrode device, the electrode device may be interpreted as a lumped constant circuit in which an inductor, a capacitor and a resistor are concentrated on a point. In this case, as described above, when the electrode device is an inductor, plasma generated between the substrate and a planar member such as 110 of FIGS. 5A through 5D is referred to as inductively coupled plasma (ICP), and when the electrode device is a capacitor, plasma generated between the substrate and a planar member such as 110 of FIGS. 5A through 5D is referred to as capacitively coupled plasma (CCP).

When a high frequency signal is input to the electrode device so that high-density plasma can be generated, the size of the electrode device is similar to the wavelength of an input frequency. Thus, referring to FIG. 10B, even in case of the ICP in which the electrode device is the inductor, the electrode device includes a capacitor component and cannot be interpreted as a lumped constant circuit and should be interpreted as a distributed constant circuit. In other words, amplitudes and phases of voltage and current inside the electrode device are varied in a space and thus, the flow of electrical energy that occurs in the electrode device should be interpreted by using a transmission theory of electromagnetic waves. In the transmission theory, the electrode device is used as a transmission line, and when proceeding directions of voltage and current along the transmission line are different, a forwarded wave and a reflected wave are generated so that a standing wave is generated. Thus, a node to which energy is not supplied is generated. The node of the standing wave generated inside the electrode device causes the non-uniform density of plasma.

Figure 11:
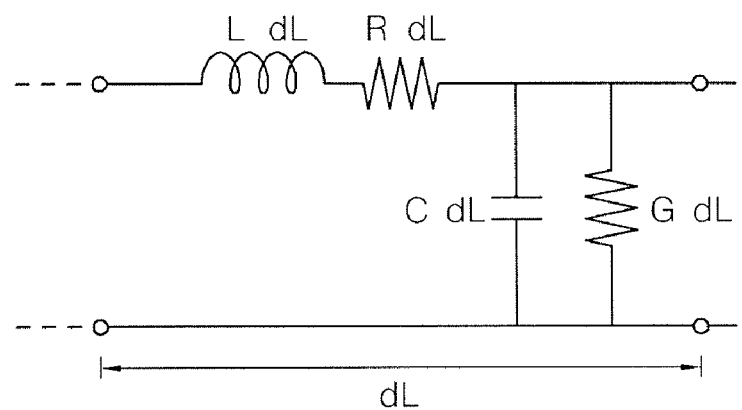
FIG. 11 is a circuit diagram of a unit length of a transmission line so as to interpret a distributed constant circuit by using a transmission theory.

FIG. 11 is a circuit diagram of a unit length of a transmission line so as to interpret a distributed constant circuit by using a transmission theory. Referring to FIG. 11, when voltage and current rules are applied to the circuit diagram of FIG. 11, the voltage and current may be expressed by Equation 1 in a transmission line having the length of L:

$$V(L) = V_0^+ e^{-j\beta L} + V_0^- e^{+j\beta L}$$

$$I(L) = I_0^+ e^{-j\beta L} + I_0^- e^{+j\beta L} \quad (1),$$

where $V_0^+$ and $I_0^+$ are voltage and current of a forwarded wave, and $V_0^-$ and $I_0^-$ are voltage and current of a reflected wave, and $\beta$ is a propagation constant and $\beta=\omega/c$.

By using Equation 1, an input impedance may be expressed as a reflection coefficient and the length of the transmission line by using Equation 2:

$$Z_{in} = Z_0 \frac{1 + \Gamma e^{-2j\beta L}}{1 - \Gamma e^{-2j\beta L}} \quad (2)$$

$$\Gamma = \frac{V_0^-}{V_0^+},$$

where $Z_{in}$ is an input impedance, and $Z_0$ is a characteristic impedance of the transmission line, and $\Gamma$ is a reflection coefficient.

The reflection coefficient is varied according to the structural shape of the transmission line, i.e., the electrode device. The electrode device may have a structure in which the reflection coefficient is 0 so that the input impedance and the characteristic impedance can be the same and the reflected wave cannot be generated.

Figure 12:
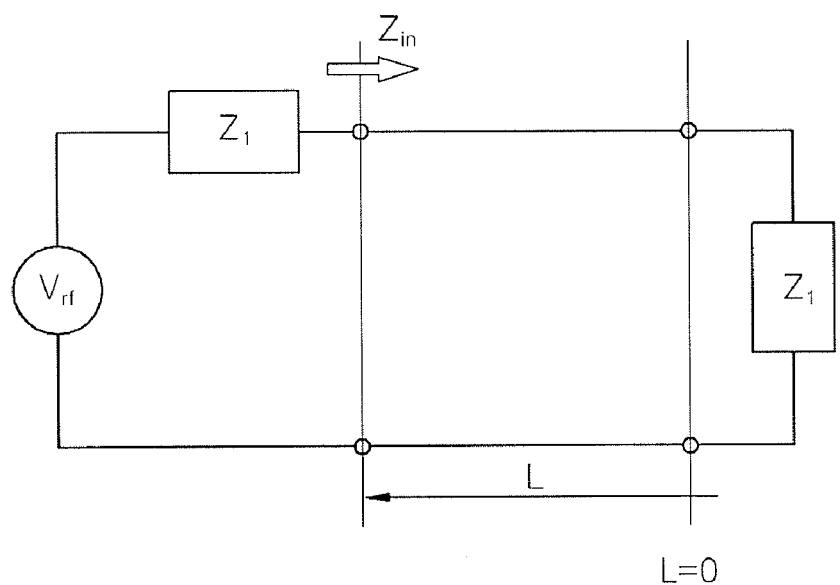
FIG. 12 is a circuit diagram of a high frequency power supply source, an impedance matcher, and the electrode device of FIGS. 5A through 5D, which are represented as impedances, according to an embodiment of the present invention.

FIG. 12 is a circuit diagram of a high frequency power supply source, an impedance matcher, and the electrode device 100 for generating plasma illustrated in FIGS. 5A through 5D, which are represented as impedances, according to an embodiment of the present invention. Referring to FIG. 12, electrical power supplied by an RF power supply source $V_{rf}$ is transmitted to the planar member 110 of the electrode device 100, and the linear member 120 of the electrode device 100 serves as the transmission line. In this case, an impedance matcher $Z_1$ matches the impedance of the RF power supply source $V_{rf}$ and the input impedance $Z_{in}$ the linear member 120 to 50Ω. However, the forwarded wave and the reflected wave are generated in the high frequency signal that is matched and proceeds, and the input impedance $Z_{in}$ measured by the impedance matcher $Z_1$ and an actual impedance of the linear member 120 are varied, and the varied impedance is referred to as an effective impedance $Z_e$. When a low frequency signal is supplied to the electrode device 100 of FIGS. 5A through 5D, the input impedance $Z_{in}$ and the effective impedance $Z_e$ are all the same, and when a high frequency signal is supplied to the electrode device 100 of FIGS. 5A through 5D, a characteristic impedance $Z_0$ of the linear member 120 is newly generated so that the input impedance $Z_{in}$ and the effective impedance $Z_e$ are varied. When the characteristic impedance $Z_0$ is made the same as the effective impedance $Z_e$, as shown in Equation 2, the reflection coefficient of the linear member 120 is 0, and the reflected wave is not generated in the planar member 110 that is a final end, and the standing wave is not generated. Also, an impedance $Z_L$ of the planar member 110 is also the same as the characteristic impedance $Z_0$. Due to the phenomenon, the uniformity of density of the plasma can be improved.

The electrode device 100 for generating plasma illustrated in FIGS. 5A through 5D has the three dimensional and symmetrical structure as shown in FIGS. 8A through 8D or 9 so that the reflection coefficient can be minimized and the characteristic impedance and the effective impedance can be the same. The linear member 120 has a tree-shaped structure in which the high frequency signal supplied to the feeding member 126 is divided at each division point and is transmitted to all feeding points. The tree-shaped structure shows that the reflection coefficient is reduced as a level of the tree-shaped structure is decreased.

Figure 13:
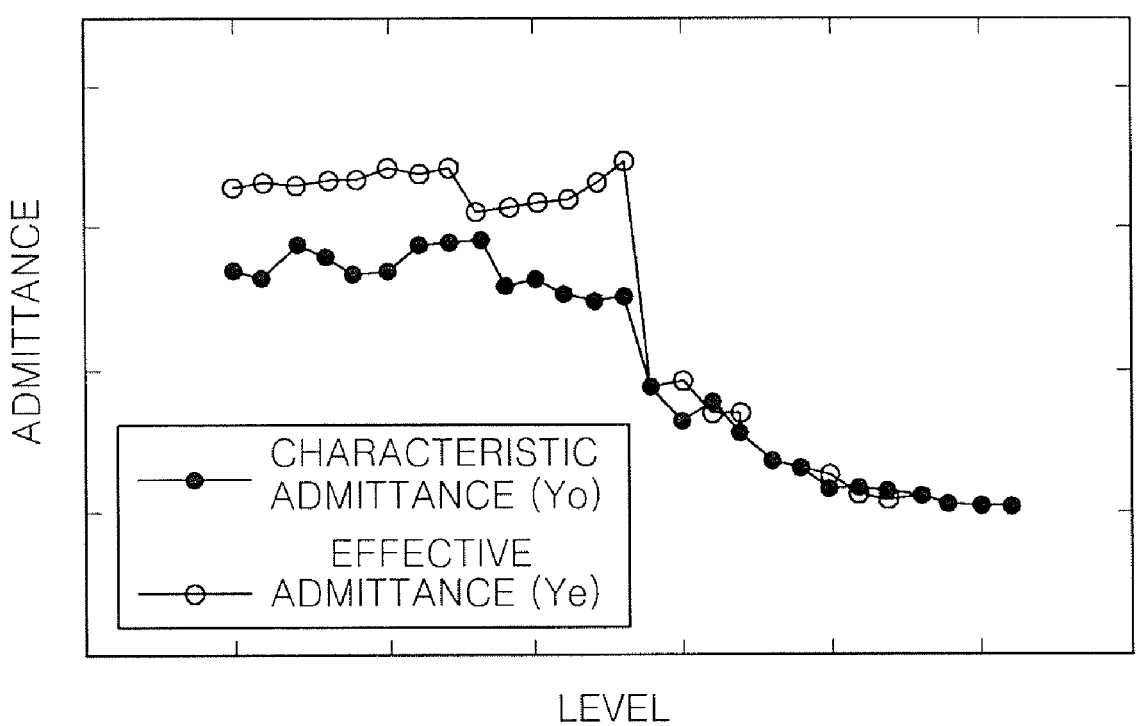
FIG. 13 is a graph showing admittance measured at each level from an upper level to a lower level of a tree-shaped structure.

FIG. 13 is a graph showing admittance measured at each level from an upper level to a lower level of the tree-shaped structure. Referring to FIG. 13, since the reflection coefficient is large at the upper level of the tree-shaped structure, a difference between characteristic admittance $Y_0$ and effective admittance $Y_e$ is large. However, as the tree-shaped structure is closer to the lower level, the characteristic admittance $Y_0$ and the effective admittance $Y_e$ are identical to each other, because the reflection coefficient is gradually reduced and becomes 0. Thus, as illustrated in FIG. 13, the linear member 120 of the electrode device 100 for generating plasma illustrated in FIGS. 5A through 5D has a structure for minimizing the reflection coefficient and can suppress generation of the reflected wave.

Figure 14A:
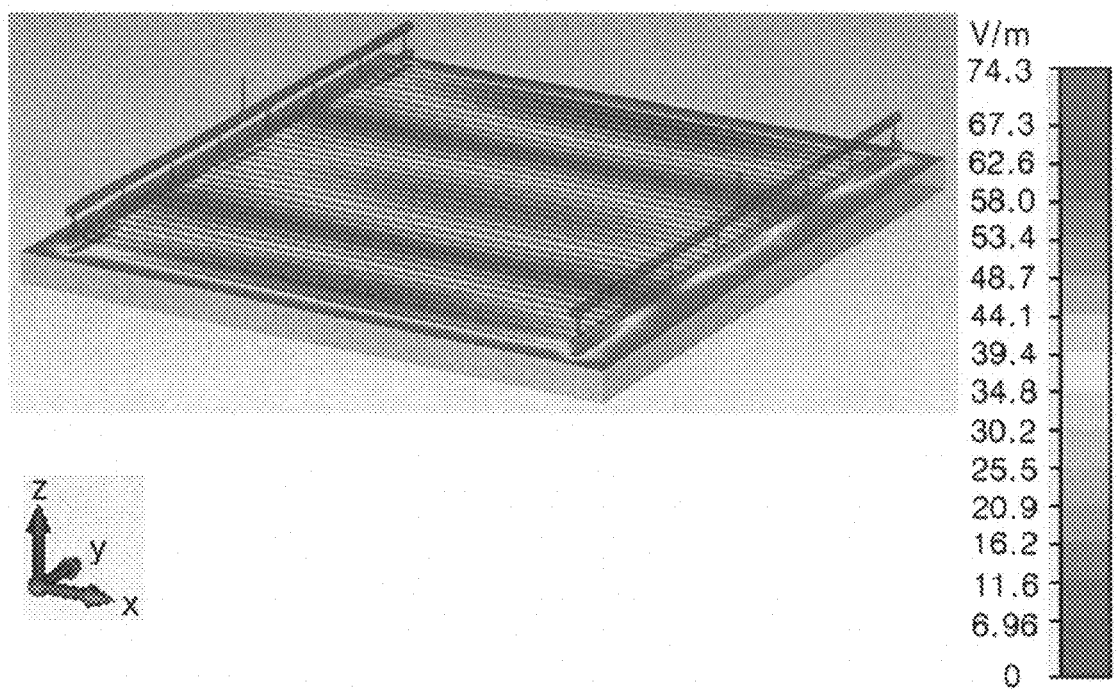
FIGS. 14A through 14C illustrate distribution of electric potentials formed on a substrate disposed on a lower portion of each of electrode devices according to another embodiments of the present invention, when shapes of the electrode devices are different.
Figure 14B:
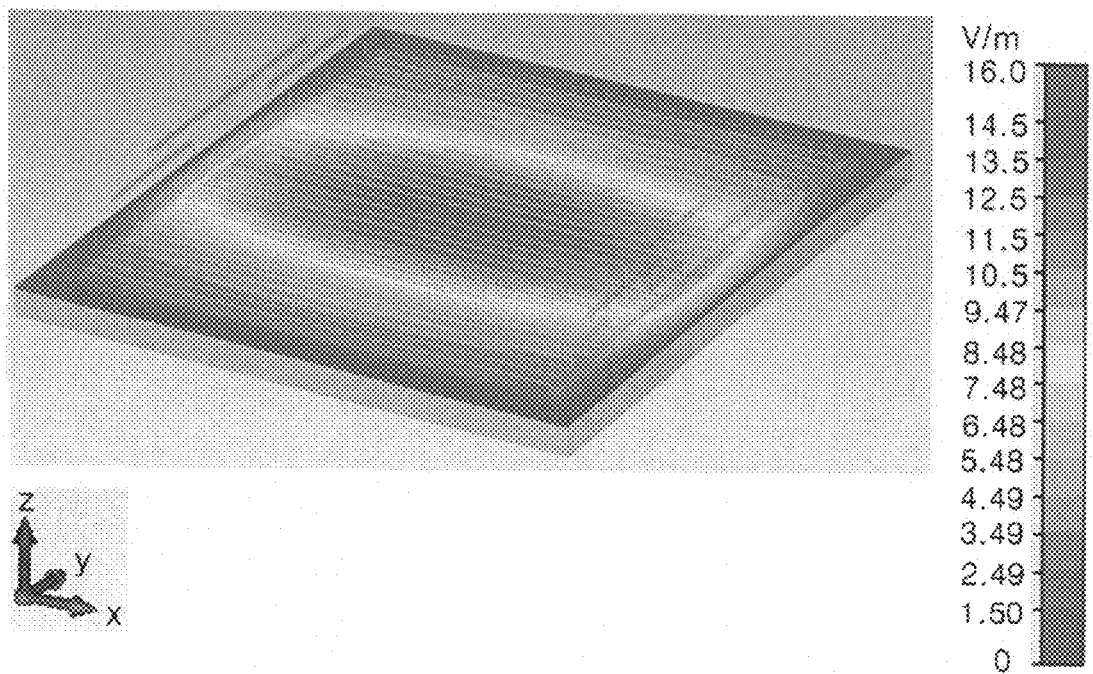
Figure 14C:
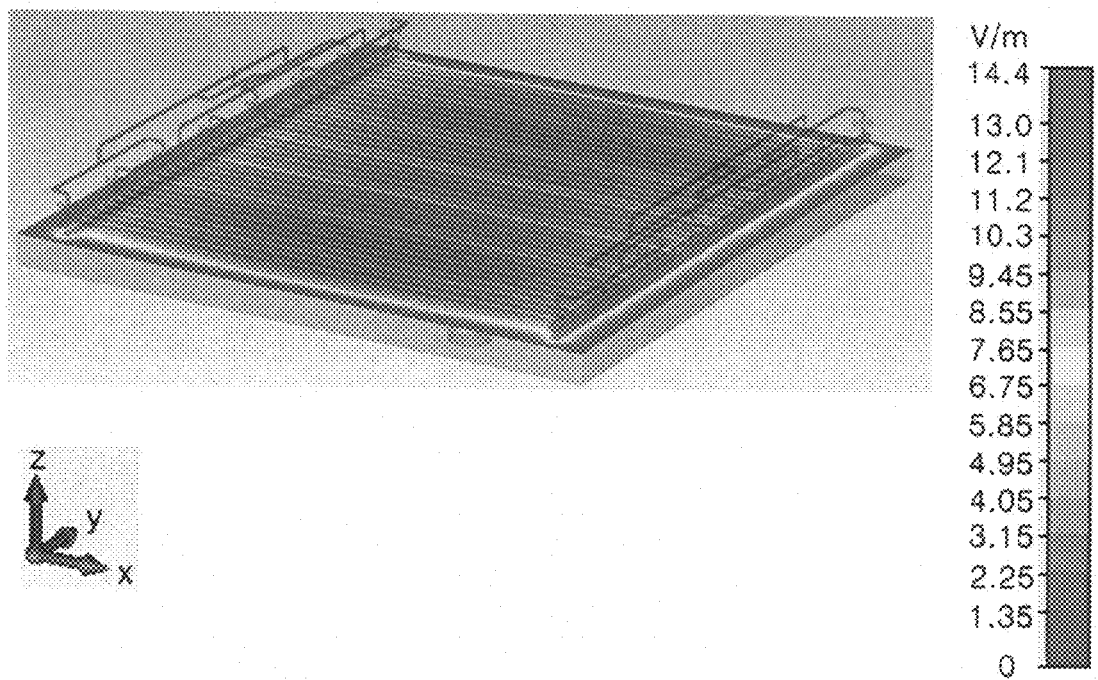

FIGS. 14A through 14C illustrate distribution of electric potentials formed on a substrate disposed in a lower portion of each of electrode devices according to another embodiments of the present invention, when shapes of the electrode devices are different.

The shape of the electrode device illustrated in FIG. 14A is a conventional shape that is used so as to remove a standing wave generated in the electrode device. Distances between a point to which a high frequency signal is input and each feeding point are different. Referring to FIG. 14A, the standing wave is generated in the electrode device so that the node of the standing wave is remarkably generated from distribution of electric potentials.

The shape of the electrode device illustrated in FIG. 14B is a tree-shaped structure in which distances between the point to which a high frequency signal is input and each feeding point are all the same. However, the electrode device illustrated in FIG. 14B has a two dimensional and tree-shaped structure unlike the shape of the linear member 120 of the electrode device 100 for generating plasma illustrated in FIGS. 5A through 5D. Referring to FIG. 14B, the node of the standing wave is not remarkably generated in the distribution of electric potentials illustrated in FIG. 14A but the distribution of electric potentials is non-uniform and uniformity of a plasma density cannot be guaranteed.

The shape of the electrode device illustrated in FIG. 14C is the electrode device 100 for generating plasma illustrated in FIGS. 5A through 5D. Referring to FIG. 14C, distribution of electric potentials appears uniformly, and the node of the standing wave is not generated. Referring to FIGS. 14A through 14C, the linear member 120 of the electrode device 100 for generating plasma illustrated in FIGS. 5A through 5D has a three dimensional and symmetrical tree-shaped structure so that the reflection coefficient is closer to 0 and generation of the standing wave can be suppressed.

Experiments for measuring variation of admittance along a path from a point to which a high frequency signal is applied to each feeding point were performed in each of the electrode devices illustrated in FIGS. 14A through 14C.

Figure 15A:
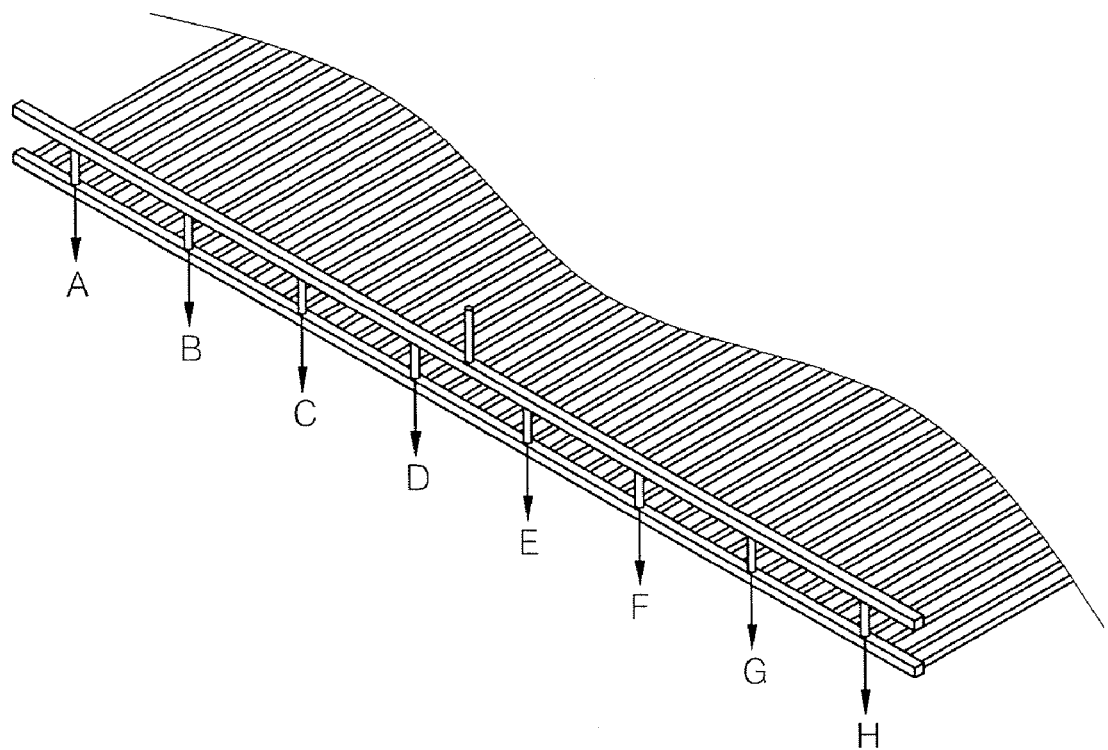
FIGS. 15A and 15B illustrate each feeding point and each measurement position of admittance on a path from a point at which a high frequency signal is input to the feeding point, of the electrode device illustrated in FIG. 14A and admittance measured in each measurement position.
Figure 15A:
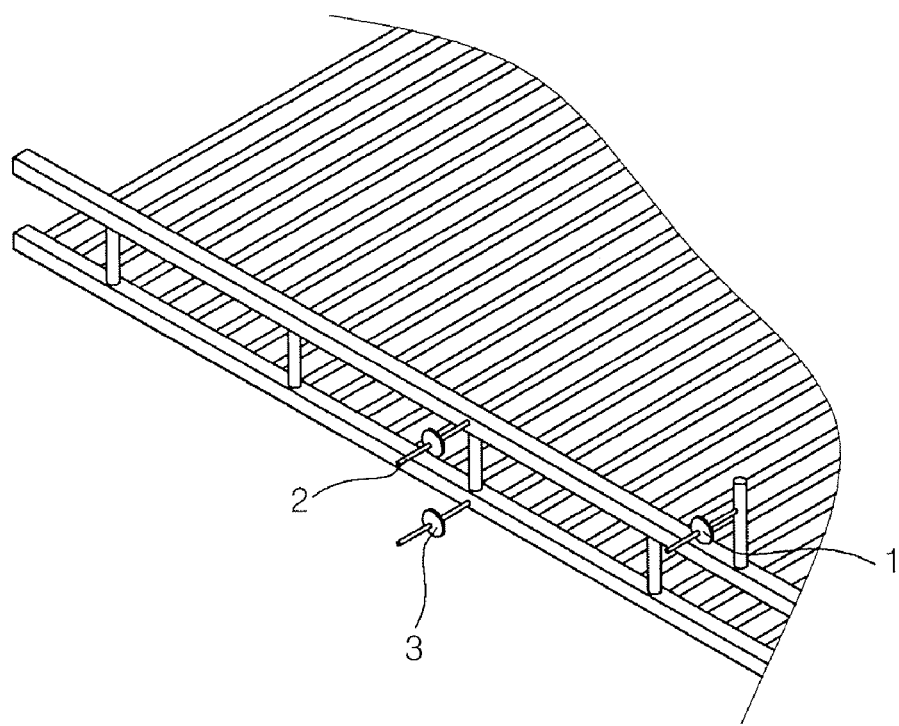
Figure 15B:
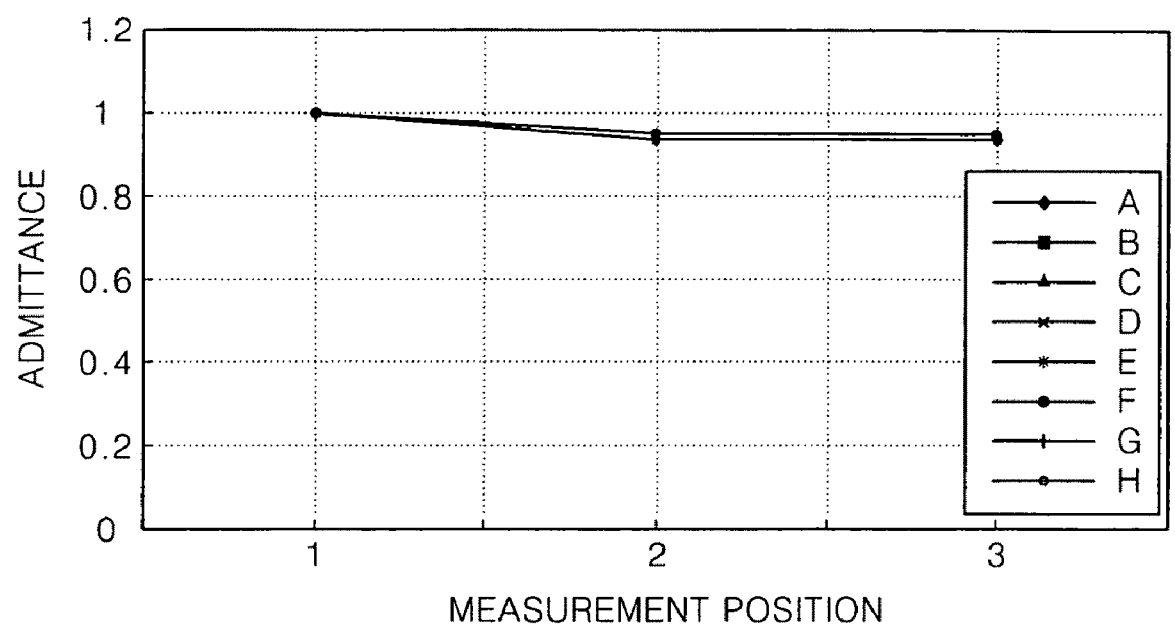

FIG. 15A illustrates each feeding point and each measurement position of an admittance on a path from a point at which a high frequency signal is input to the feeding point, of the electrode device illustrated in FIG. 14A, and FIG. 15B is a graph showing admittance measured in each measurement position. Referring to FIG. 15A, a high frequency signal is transmitted to each feeding point marked by A through H via points marked by 1 through 3. Referring to FIG. 15B, as a result of measuring admittance in measurement positions 1 through 3, there is no variation of admittance up to each feeding point, because there is no variation of the size of a reflection coefficient and a reflected wave is generated in the electrode device. As such, the node of the standing wave can be found in FIG. 14A.

Figure 16A:
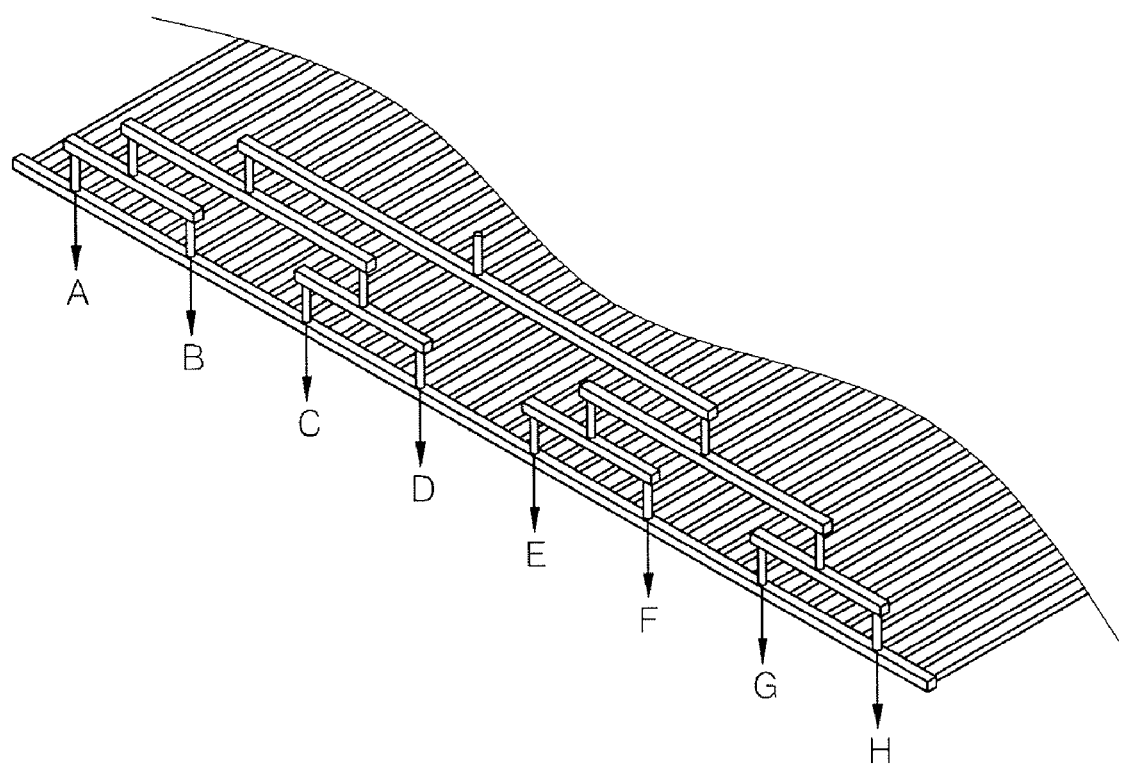
FIGS. 16A and 16B illustrate each feeding point and each measurement position of admittance on a path from a point at which a high frequency signal is input to the feeding point, of the electrode device illustrated in FIG. 14B and admittance measured in each measurement position.
Figure 16A:
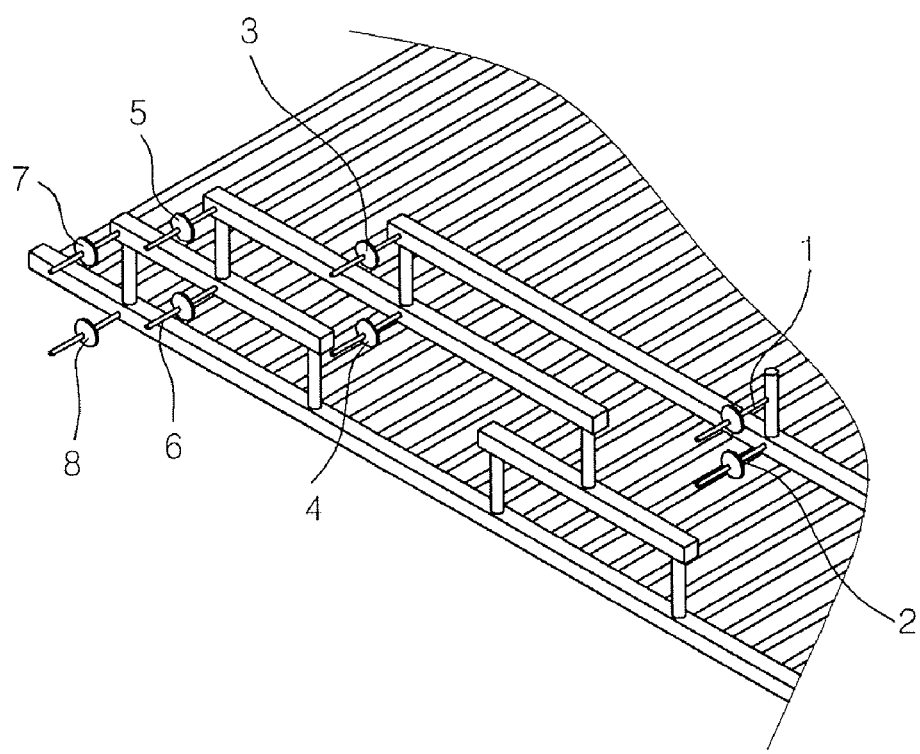
Figure 16B:
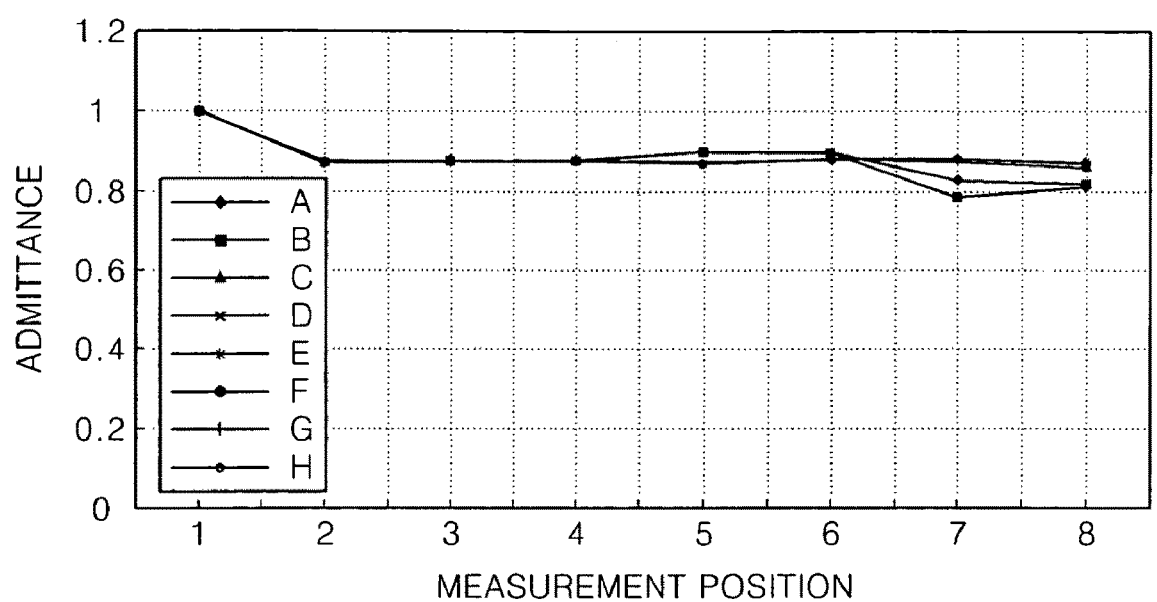

FIG. 16A illustrates each feeding point and each measurement position of an admittance on a path from a point at which a high frequency signal is input to the feeding point, of the electrode device illustrated in FIG. 14B, and FIG. 16B is a graph showing admittance measured in each measurement position. Referring to FIG. 16A, admittance is measured in eight measurement positions selected on a path from a point to which a high frequency signal is input to each feeding point marked by A through H. Referring to FIG. 16B, there is a little variation of admittance as compared to the graph of FIG. 15B but there is still a small variation width. Thus, even in case of a two dimensional tree-shaped structure, the node of the standing wave is still generated in the electrode device, which can be found in the distribution of electric potentials illustrated in FIG. 14B.

Figure 17A:
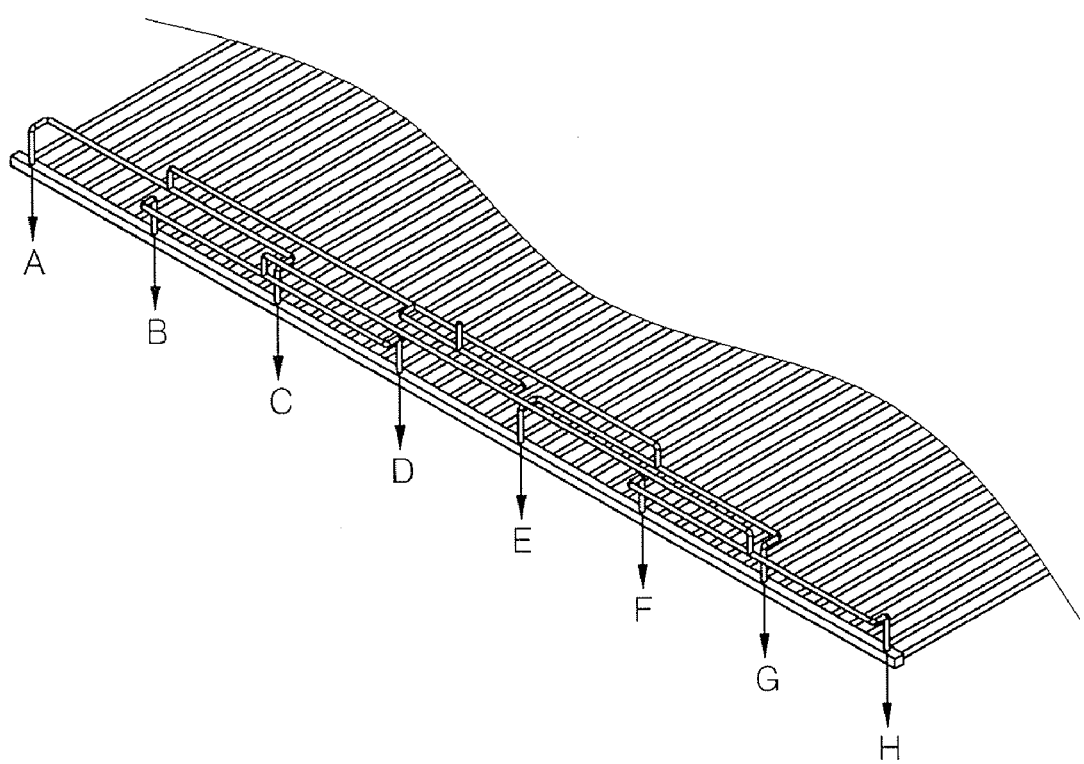
FIGS. 17A and 17B illustrate each feeding point and each measurement position of an admittance on a path from a point at which a high frequency signal is input to the feeding point, of the electrode device illustrated in FIG. 14C and admittance measured in each measurement position.
Figure 17A:
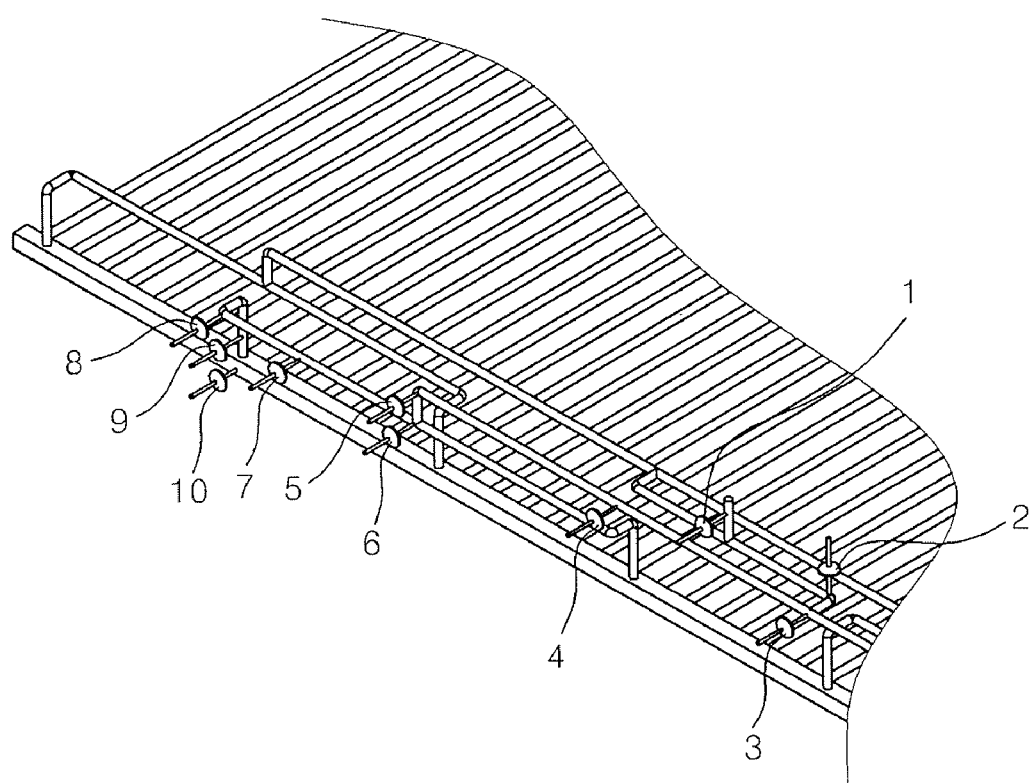
Figure 17B:
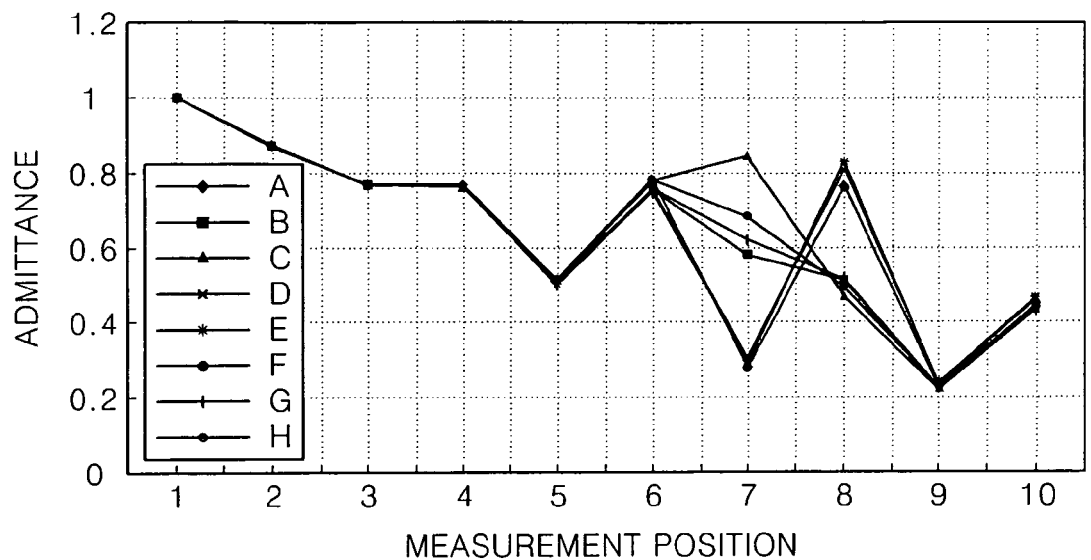

FIG. 17A illustrates each feeding point and each measurement position of an admittance on a path from a point at which a high frequency signal is input to the feeding point, of the electrode device illustrated in FIG. 14C, and FIG. 17B is a graph showing admittance measured in each measurement position. Referring to FIG. 17A, admittance is measured in ten measurement positions selected on a path from a point to which a high frequency signal is input to each feeding point marked by A through H. Referring to FIG. 17B, when input admittance (point 1) and admittance (point 10) of the planar member 110 are compared with each other by an impedance matcher, the admittance of the planar member 110 is reduced. This means that the value of the reflection coefficient is reduced, and generation of the standing wave is suppressed so that the node of the standing wave cannot be found in the distribution of electric potentials as illustrated in FIG. 14C.

Figure 18A:
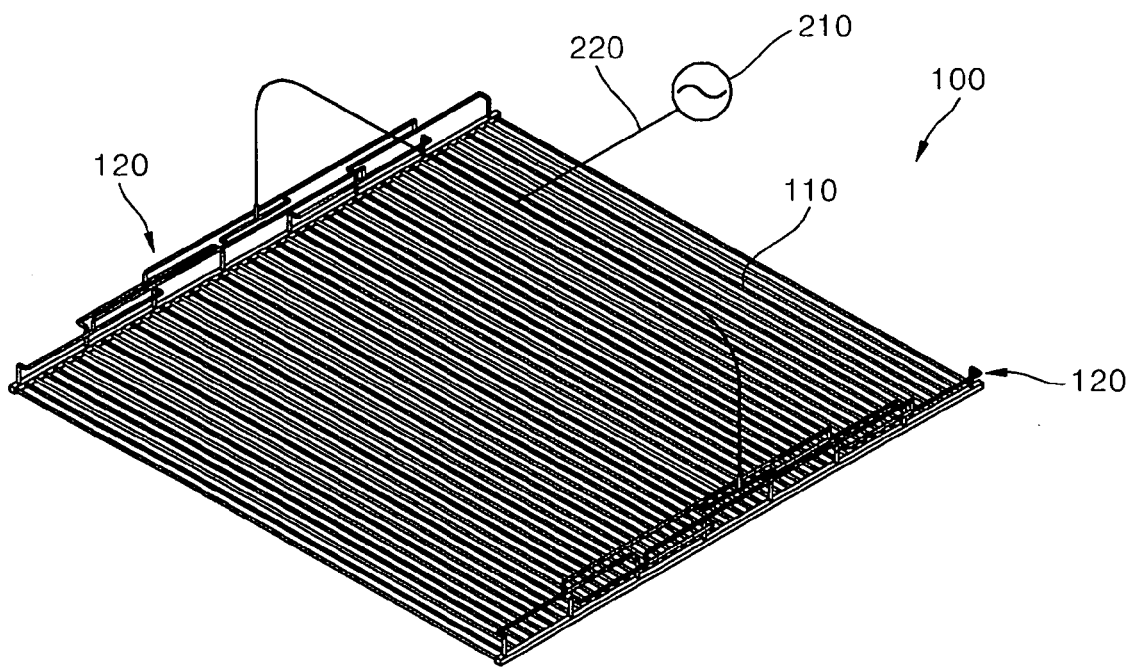
FIGS. 18A and 18B illustrate an apparatus for generating plasma according to an embodiment of the present invention.
Figure 18B:
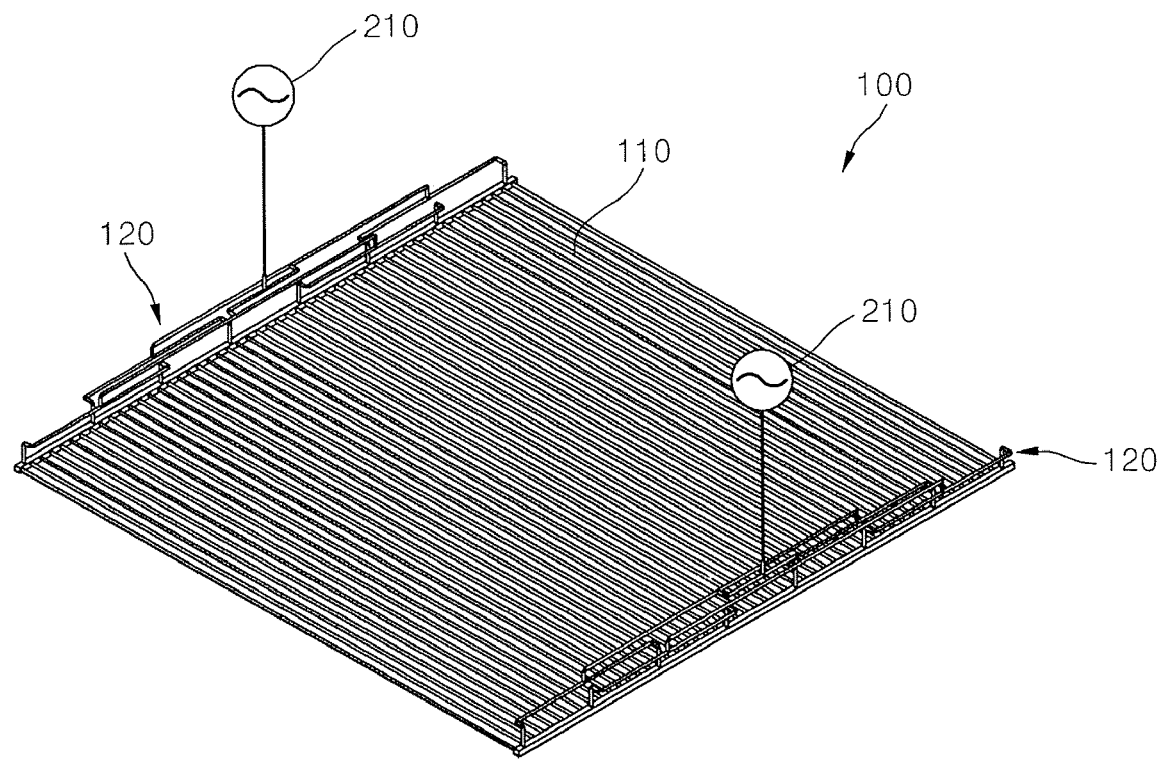

FIGS. 18A and 18B illustrate an apparatus for generating plasma according to an embodiment of the present invention. Referring to FIGS. 18A and 18B, the apparatus for generating plasma according to the present embodiment includes a power supply unit 210, a feedthrough 220, and an electrode device 100. The electrode device 100 generates plasma between the electrode device 100 and a substrate disposed in a lower portion of the electrode device 100 due to a high frequency signal supplied to the electrode device 100 and is the same as the electrode device 100 for generating plasma illustrated in FIGS. 5A through 5D.

The power supply unit 210 generates a high frequency signal to be supplied to the electrode device 100, and the feedthrough 220 provides the high frequency signal supplied by the power supply unit 210 to the electrode device 100.

The electrode device 100 is disposed to face a susceptor that supports the substrate, and includes a planar member 110 that generates plasma between the planar member 110 and the substrate, and a linear member 120 that provides the high frequency signal supplied by the power supply unit 210 to the planar member 110 via a plurality of feeding points electrically connected to the planar member 110 and allows admittance to be reduced as the linear member 120 is closer to a feeding point on a path from a point for supplying the high frequency signal to each feeding point. The structure of the electrode device 100 and the principle for suppressing generation of the standing wave by reducing admittance are as described above and thus, a detailed description thereof will not be provided here.

One or a plurality of linear members 120 of the electrode device 100 may be disposed on the planar member 110, as described above.

When the electrode device 100 includes a plurality of linear members 120, the feedthrough 220 has a tree-shaped structure so that electrical lengths from the power supply unit 210 to each linear member 120 are all the same. The linear member 120 has a structure in which electrical lengths from a supply point of the high frequency signal to each feeding point are all the same. Thus, electrical lengths from the power supply unit 210 to each feeding point are all the same and the high frequency signal is uniformly distributed to the electrode device 100.

Also, when the electrode device 100 includes a plurality of linear members 120, a high frequency signal having the same frequency may be supplied to each linear member 120, as illustrated in FIG. 18A, and high frequency signals having different frequencies may be supplied to each linear member 120, as illustrated in FIG. 18B.

In the apparatus for generating plasma illustrated in FIGS. 18A and 18B, each of linear members 120 is disposed in parallel to face each other. However, when more feeding points are in a straight line and one linear member 120 cannot be connected to all feeding points, the plurality of linear members 120 are disposed in a lateral direction. Even in this case, the feedthrough 220 is maintained to have a tree-shaped structure so that high frequency signals can be supplied uniformly to each linear member 120.

Figure 19A:
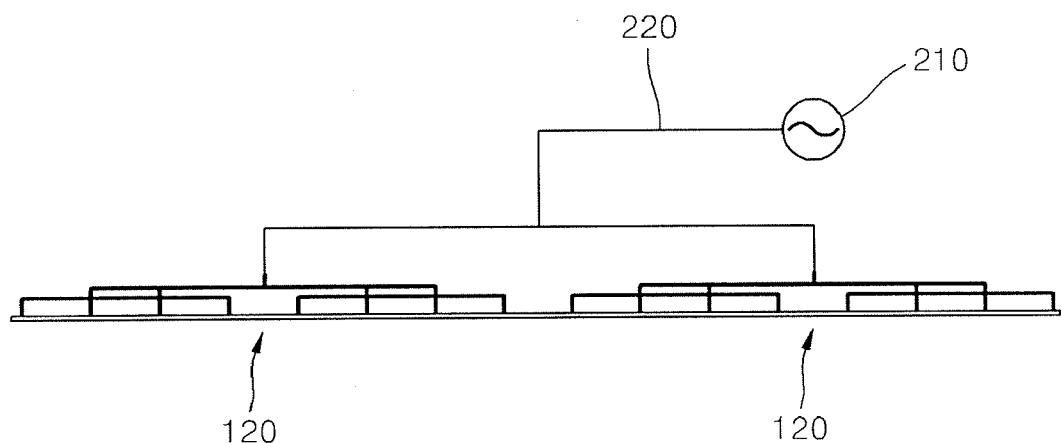
FIGS. 19A and 19B illustrate a feedthrough when a plurality of linear members are disposed in a lateral direction.
Figure 19B:
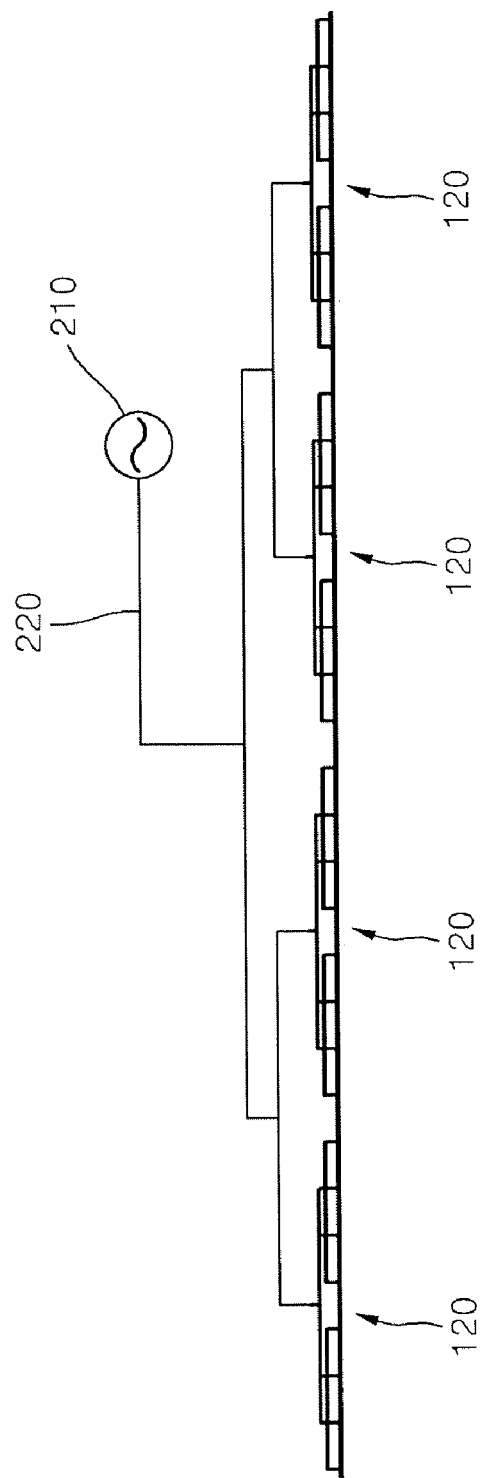

FIGS. 19A and 19B illustrate the feedthrough 220 when the plurality of linear members 120 are disposed in a lateral direction. Referring to FIG. 19A, when the linear members 120 have the structure of FIGS. 8A through 8D and 16 feeding points are present, two linear members 120 need to be disposed in a lateral direction. Thus, the feedthrough 220 has the tree-shaped structure of FIG. 19A so that the high frequency signal can be uniformly distributed to a feeding member 126 of each linear member 120.

Referring to FIG. 19B, when 32 feeding points are present, four linear members 120 illustrated in FIGS. 8A through 8D need to be provided. Thus, as illustrated in FIG. 19B, the four linear members 120 are disposed in parallel in a lateral direction, and the feedthrough 220 is disposed to have the tree-shaped structure so that high frequency signals can be supplied uniformly to each linear member 120.

As described above, standing wave occurs due to the interference between two waves travelling in opposite directions: forwarded and reflected waves. In general, electrical waves are reflected where impedance is not matched. In the tree-shaped structure composed of multiple bifurcations according to the present invention, reflection occurs at bifurcation sites. Reflected waves move back and forth in the structure and are attenuated down eventually. Thus, the structure minimizes the effect of reflected waves on the linear electrodes so that standing wave can be removed.

In the electrode device 100 and the apparatus for generating plasma according to the present invention, the electrode device 100 includes a plurality of linear members 120 having the same electrical lengths from points at which a high frequency signal is applied to the electrode device 100 to a feeding point and allowing admittance to be reduced as each linear member is closer to the feeding point, thereby minimizing a reflection coefficient of the electrode device 100, suppressing generation of a reflected wave, and preventing generation of a node of a standing wave so that plasma having a uniform density can be generated due to the high frequency signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electrode device for generating plasma, the electrode device comprising:
    a planar member disposed to face a susceptor supporting a substrate and generating plasma between the substrate and the planar member; and
    a linear member providing a high frequency signal to the planar member via a plurality of feeding points that are electrically connected to the planar member and allowing admittance of a point on the linear member to be reduced as the point on the linear member gets closer to the feeding point on a path from a supply point at which the high frequency signal is supplied to the linear member, to each of the feeding points,
    wherein the linear member comprises a connection unit, the connection unit comprising:
    a first member connecting two feeding points from among four feeding points disposed adjacent to one another in a straight line and is disposed to be separated from a plane that includes the straight line in which the feeding points are formed and forms a predetermined angle with the planar member; and
    a second member connecting two feeding points to which the first member is not connected, from among the four feeding points and is disposed symmetrical with the first member with respect to the plane that includes the straight line in which the feeding points are formed.

2. The electrode device of claim 1, wherein the first member of the connection unit comprises:
    a pair of first vertical portions connected to two feeding points from among four feeding points disposed adjacent to one another in a straight line and being parallel to each other; and
    a first connection portion connecting ends of the pair of first vertical portions to each other and disposed to be separated from a plane that includes the first vertical portions, and
    wherein the second member of the connection unit comprises:
    a pair of second vertical portions connected to two feeding points to which the first vertical portions are not connected, from among the four feeding points and being parallel to each other; and
    a second connection portion connecting ends of the pair of second vertical portions to each other and disposed symmetrical with the first connection portion with respect to a plane that includes the second vertical portions.

3. The electrode device of claim 1, wherein the linear member comprises:
    a plurality of first members, each comprising a pair of first vertical portions extending in a direction and connected to each feeding point to be parallel to each other, a pair of first extension portions extending in a direction that crosses a lengthwise direction of the first vertical portions from each end of the pair of first vertical portions, and a first connection portion connecting ends of the pair of first extension portions to each other, and each disposed to be separated from one another in a direction;
    a plurality of second members, each comprising a pair of second vertical portions extending in a direction and connected to each feeding point alternately with each first vertical portion to be parallel to each other, a pair of second extension portions extending in a different direction from the lengthwise direction of the first extension portions based on a plane that includes the second vertical portions from each end of the pair of second vertical portions, and a second connection portion connecting ends of the pair of second extension portions to each other, and each disposed to be separated from one another in the same direction as a direction of arrangement of the first members;
    a first connection member disposed above the plurality of first members so that both ends of the first connection member are connected to a center of the first connection portion;
    a second connection member disposed above the plurality of second members so that both ends of the second connection member are connected to a center of the second connection portion; and
    a feeding member connecting the centers of the first connection member and the second connection member so that a supply point of a high frequency signal is in the center of the feeding member.

4. The electrode device of claim 3, wherein the linear member further comprises a rod-shaped base member having a top surface in which a plurality of feeding points are formed at regular intervals along a lengthwise direction and coupled to a top surface of the planar member.

5. The electrode device of claim 3, wherein the linear member is coupled to the top surface of the planar member so that the linear member passes through a center of the planar member.

6. The electrode device of claim 3, comprising a plurality of linear members, wherein the plurality of linear members are coupled to the top surface of the planar member in parallel.

7. The electrode device of claim 6, wherein high frequency signals having different frequencies are supplied to each of the plurality of linear members.

8. The electrode device of claim 3, wherein the planar member has a rectangular plate shape.

9. The electrode device of claim 3, wherein the planar member comprises a plurality of rod-shaped frames disposed to be separated from one another in parallel.

10. The electrode device of claim 9, wherein the plurality of feeding points are formed in a straight line that is parallel to the frames.

11. The electrode device of claim 9, wherein the plurality of feeding points are formed in a straight line that is perpendicular to the frames.

12. The electrode device of claim 3, wherein the planar member comprises a lattice-shaped frame.

13. The electrode device of claim 3, wherein a frequency of the high frequency signal is equal to or higher than 400 kHz and is equal to or lower than 300 MHz.

14. An apparatus for generating plasma, the apparatus comprising:
an electrode generating plasma between the electrode and a substrate disposed in a lower portion of the electrode due to a high frequency signal supplied to the electrode;
a power supply unit generating a high frequency signal to be supplied to the electrode; and
a feedthrough providing the high frequency signal supplied by the power supply unit to the electrode,
wherein the electrode comprises:
a planar member disposed to face a susceptor supporting a substrate and generating plasma between the substrate and the planar member; and
a linear member providing a high frequency signal to the planar member via a plurality of feeding points that are electrically connected to the planar member and allowing admittance of a point on the linear member to be reduced as the point on the linear member gets closer to the feeding point on a path from a supply point at which the high frequency signal is supplied to the linear member, to each of the feeding points,
wherein the linear member comprises a connection unit, the connection unit comprising:
a first member connecting two feeding points from among four feeding points disposed adjacent to one another in a straight line and is disposed to be separated from a plane that includes the straight line in which the feeding points are formed and forms a predetermined angle with the planar member; and
a second member connecting two feeding points to which the first member is not connected, from among the four feeding points and is disposed symmetrical with the first member with respect to the plane that includes the straight line in which the feeding points are formed.

15. The apparatus of claim 14, wherein the first member of the connection unit comprises:
a pair of first vertical portions connected to two feeding points from among four feeding points disposed adjacent to one another in a straight line and being parallel to each other; and
a first connection portion connecting ends of the pair of first vertical portions to each other and disposed to be separated from a plane that includes the first vertical portions, and
wherein the second member of the connection unit comprises:
a pair of second vertical portions connected to two feeding points to which the first vertical portions are not connected, from among the four feeding points and being parallel to each other; and
a second connection portion connecting ends of the pair of second vertical portions to each other and disposed symmetrical with the first connection portion with respect to a plane that includes the second vertical portions.

16. The apparatus of claim 14, wherein the linear member comprises:
a plurality of first members, each comprising a pair of first vertical portions extending in a direction and connected to each feeding point to be parallel to each other, a pair of first extension portions extending in a direction that crosses a lengthwise direction of the first vertical portions from each end of the pair of first vertical portions, and a first connection portion connecting ends of the pair of first extension portions to each other, and each disposed to be separated from one another in a direction;
a plurality of second members, each comprising a pair of second vertical portions extending in a direction and connected to each feeding point alternately with each first vertical portion to be parallel to each other, a pair of second extension portions extending in a different direction from the lengthwise direction of the first extension portions based on a plane that includes the second vertical portions from each end of the pair of second vertical portions, and a second connection portion connecting ends of the pair of second extension portions to each other, and each disposed to be separated from one another in the same direction as a direction of arrangement of the first members;
a first connection member disposed above the plurality of first members so that both ends of the first connection member are connected to a center of the first connection portion;
a second connection member disposed above the plurality of second members so that both ends of the second connection member are connected to a center of the second connection portion; and
a feeding member connecting the centers of the first connection member and the second connection member so that a supply point of a high frequency signal is in the center of the feeding member.

17. The apparatus of claim 16, wherein, when the electrode comprises a plurality of linear members, the feedthrough has a tree-shaped structure so that electrical lengths from the power supply unit to each linear member are all the same.

18. The apparatus of claim 17, wherein the power supply unit supplies high frequency signals having different frequencies to each of the plurality of linear members.

* * * * *